US008421068B2

(12) United States Patent
Yamazaki et al.

(10) Patent No.: US 8,421,068 B2
(45) Date of Patent: *Apr. 16, 2013

(54) SEMICONDUCTOR DEVICE AND MANUFACTURING METHOD THEREOF

(75) Inventors: Shunpei Yamazaki, Tokyo (JP); Jun Koyama, Kanagawa (JP); Hiroyuki Miyake, Kanagawa (JP); Kei Takahashi, Kanagawa (JP); Kouhei Toyotaka, Kanagawa (JP); Masashi Tsubuku, Kanagawa (JP); Kosei Noda, Kanagawa (JP); Hideaki Kuwabara, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 55 days.

This patent is subject to a terminal disclaimer.

(21) Appl. No.: 12/904,565

(22) Filed: Oct. 14, 2010

(65) Prior Publication Data
US 2011/0089414 A1 Apr. 21, 2011

(30) Foreign Application Priority Data

Oct. 16, 2009 (JP) ................. 2009-238885

(51) Int. Cl.
*H01L 29/10* (2006.01)
*H01L 29/12* (2006.01)
*H01L 29/04* (2006.01)
*H01L 31/00* (2006.01)
*H01L 27/15* (2006.01)
*H01L 29/26* (2006.01)
*H01L 31/12* (2006.01)
*H01L 33/00* (2010.01)

(52) U.S. Cl.
USPC .................. 257/43; 257/52; 257/79

(58) Field of Classification Search .................. None
See application file for complete search history.

(56) References Cited

U.S. PATENT DOCUMENTS 5,079,606 A 1/1992 Yamamura et al.
5,731,856 A 3/1998 Kim et al.
(Continued)

FOREIGN PATENT DOCUMENTS

EP 0 380 122 A1 8/1990
EP 1 737 044 A1 12/2006
(Continued)

OTHER PUBLICATIONS

Hiromi Nowatari et al.; "60.2: Intermediate Connector with Suppressed Voltage Loss for White Tandem OLEDs"; SID Digest '09 : SID International Symposium Digest of Technical Papers; May 31, 2009; pp. 899-902; vol. 40.

(Continued)

*Primary Examiner* — Fernando L Toledo
*Assistant Examiner* — Valerie N Newton
(74) *Attorney, Agent, or Firm* — Fish & Richardson P.C.

(57) ABSTRACT

An object is to reduce leakage current and parasitic capacitance of a transistor used for an LSI, a CPU, or a memory. A semiconductor integrated circuit such as an LSI, a CPU, or a memory is manufactured using a thin film transistor in which a channel formation region is formed using an oxide semiconductor which becomes an intrinsic or substantially intrinsic semiconductor by removing impurities which serve as electron donors (donors) from the oxide semiconductor and has larger energy gap than that of a silicon semiconductor. With use of a thin film transistor using a highly purified oxide semiconductor layer with sufficiently reduced hydrogen concentration, a semiconductor device with low power consumption due to leakage current can be realized.

14 Claims, 18 Drawing Sheets

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,509,616 | B2 | 1/2003 | Yamazaki |
| 6,563,174 | B2 | 5/2003 | Kawasaki et al. |
| 6,727,522 | B1 | 4/2004 | Kawasaki et al. |
| 6,765,231 | B2 | 7/2004 | Yamazaki |
| 6,787,807 | B2 | 9/2004 | Yamazaki et al. |
| 6,956,235 | B2 | 10/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,319,238 | B2 | 1/2008 | Yamazaki |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 2001/0046027 | A1 | 11/2001 | Tai et al. |
| 2002/0038889 | A1 | 4/2002 | Yamazaki et al. |
| 2002/0039813 | A1 | 4/2002 | Yamazaki |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0228389 | A1* | 10/2007 | Hsu et al. ................. 257/79 |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0135844 | A1 | 6/2008 | Yamazaki |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0045397 | A1* | 2/2009 | Iwasaki ........................ 257/43 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0084651 | A1 | 4/2010 | Yamazaki et al. |
| 2010/0085081 | A1 | 4/2010 | Ofuji et al. |
| 2010/0092800 | A1 | 4/2010 | Itagaki et al. |
| 2010/0109002 | A1 | 5/2010 | Itagaki et al. |
| 2010/0244029 | A1* | 9/2010 | Yamazaki et al. ............ 257/52 |
| 2010/0276689 | A1 | 11/2010 | Iwasaki |
| 2010/0279462 | A1 | 11/2010 | Iwasaki |
| 2011/0101331 | A1 | 5/2011 | Yamazaki et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-197176 A | 8/1990 |
| JP | 5-251705 A | 9/1993 |
| JP | 8-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-083974 A | 3/2002 |
| JP | 2002-198537 A | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2007-103918 A | 4/2007 |
| JP | 2009-004733 A | 1/2009 |
| JP | 2009-135520 A | 6/2009 |
| JP | 2009-206508 A | 9/2009 |
| WO | 2004/114391 A1 | 12/2004 |
| WO | 2007/029844 A1 | 3/2007 |
| WO | 2008/143304 A1 | 11/2008 |
| WO | 2009/096608 A1 | 8/2009 |

OTHER PUBLICATIONS

Naoko Asakuma et al.; "Crystallization and Reduction of Sol-Gel-Derived Zinc Oxide Films by Irradiation with Ultraviolet Lamp"; Journal of Sol-Gel Science and Technology; 2003; pp. 181-184; vol. 26.

Kenji Nomura et al.; "Thin-Film Transistor Fabricated in Single-Crystalline Transparent Oxide Semiconductor"; Science; May 23, 2003; pp. 1269-1272; vol. 300, No. 5623.

Jae Kyeong Jeong et al.; "3.1: Distinguished Paper: 12.1-Inch WXGA AMOLED Display Driven by Indium-Gallium-Zinc Oxide TFTs Array"; SID Digest '08 : SID International Symposium Digest of Technical Papers; May 20, 2008; pp. 1-4; vol. 39.

Chunfei Li et al.; :Modulated Structures of Homologous Compounds InMO3(ZnO)m (M=In,Ga; m=Integer) Described by Four-Dimensional Superspace Group; Journal of Solid State Chemistry; 1998; pp. 347-355; vol. 139.

Elvira M.C. Fortunato et al.; "Wide-bandgap high-mobility ZnO thin-film transistors produced at room temperature"; Applied Physics Letters; Sep. 27, 2004; pp. 2541-2543; vol. 85, No. 13.

D. Coates et al.; "Optical Studies of the Amorphous Liquid-Cholesteric Liquid Crystal Transition: The "Blue Phase""; Physics Letters; Sep. 10, 1973; pp. 115-116; vol. 45A, No. 2.

Je-hun Lee et al.; "World's Largest (15-inch) XGA AMLCD Panel Using IGZO Oxide TFT"; SID Digest '08 : SID International Symposium Digest of Technical Papers; May 20, 2008; pp. 625-628; vol. 39.

Hideo Hosono; "68.3: Invited Paper: Transparent Amorphous Oxide Semiconductors for High Performance TFT"; SID Digest '07 : SID International Symposium Digest of Technical Papers; 2007; pp. 1830-1833; vol. 38.

Takashi Hirao et al.; "Novel top-gate zinc oxide thin-film transistors (ZnO TFTs) for AMLCDs"; Journal of the SID; 2007; pp. 17-22; vol. 15, No. 1.

S. Meiboom et al.; "Theory of the Blue Phase of Cholesteric Liquid Crystals"; Physical Review Letters; May 4, 1981; pp. 1216-1219; vol. 46, No. 18.

M.J. Costello et al.; "Electron Microscopy of a cholesteric liquid crystal and its blue phase"; Physical Review A; May 1, 1984; pp. 2957-2959; vol. 29, No. 5.

Doo-Hee Cho et al.; "21.2: Al and Sn-doped Zinc Indium Oxide Thin Film Transistors for AMOLED Back-Plane"; SID Digest '09 : SID International Symposium Digest of Technical Papers; May 31, 2009; pp. 280-283.

M.W.J. Prins et al.; "A ferroelectric transparent thin-film transistor"; Applied Physics Letters; Jun. 17, 1996; pp. 3650-3652; vol. 68, No. 25.

Mitsutoshi Miyasaka; "58.2: Invited Paper: Suftla Flexible Microelectronics on Their Way to Business"; SID Digest '07 : SID International Symposium Digest of Technical Papers; 2007; pp. 1673-1676; vol. 38.

Hiroki Dembo et al.; "RFCPUS on Glass and Plastic Substrates fabricated by TFT Transfer Technology"; IEDM 05: Technical Digest of International Electron Devices Meeting; Dec. 5, 2005; pp. 1067-1069.

Horng Nan Chern et al.; "An Analytical Model for the Above-Threshold Characteristics of Polysilicon Thin-Film Transistors"; IEEE Transactions on Electron Devices; Jul. 1, 1995; pp. 1240-1246; vol. 42, No. 7.

Jae Chul Park et al., "High performance amorphous oxide thin film transistors with self-aligned top-gate structure"; IEDM 09: Technical Digest of International Electron Devices Meeting; Dec. 7, 2009; pp. 191-194.

Hirotsugu Kikuchi et al.; "39.1: Invited Paper: Optically Isotropic Nano-structured Liquid Crystal Composites for Display Applications"; SID Digest '09 : SID International Symposium Digest of Technical Papers; May 31, 2009; pp. 578-581.

Hirotsugu Kikuchi et al.; "62.2: Invited Paper: Fast Electro-Optical Switching in Polymer-Stabilized Liquid Crystalline Blue Phases for Display Application"; SID Digest '07 : SID International Symposium Digest of Technical Papers; 2007; pp. 1737-1740; vol. 38.

Hirotsugu Kikuchi et al.; "Polymer-stabilized liquid crystal blue phases"; Nature Materials; Sep. 1, 2002; pp. 64-68; vol. 1.

H.-S. Kitzerow et al.; "Observation of blue phases in chiral networks"; Liquid Crystals; 1993; pp. 911-916; vol. 14, No. 3.

Ming-Hsien Lee et al.; "15.4: Excellent Performance of Indium-Oxide-based Thin-Film Transistors by DC Sputtering"; SID Digest '09 : SID International Symposium Digest of Technical Papers; May 31, 2009; pp. 191-193.

Dong-Un Jin et al.; "65.2: Distinguished Paper: World-Largest (6.5") Flexible Full Color Top Emission AMOLED Display on Plastic Film and Its Bending Properties"; SID Digest '09 : SID International Symposium Digest of Technical Papers; May 31, 2009; pp. 983-985.

Jin-Seong Park et al.; "Amorphous Indium-Gallium-Zinc Oxide TFTs and their application for large size AMOLED"; AM-FPD '08 Digest of Technical Papers; Jul. 2, 2008; pp. 275-278.

Sang-Hee Ko Park et al.; "Challenge to Future Displays: Transparent AM-OLED driven by PEALD grown ZnO TFT"; IMID '07 Digest; 200; pp. 1249-1252.

T. Ikeda et al.; "21.2: Full-Functional System Liquid Crystal Display Using CG-Silicon Technology"; SID Digest '04 : SID International Symposium Digest of Technical Papers; 2004; pp. 860-863; vol. 35.

Yoshiyuki Kurokawa et al.; "UHF RFCPUs on Fleixble and Glass Substrates for Secure RFID Systems"; Journal of Solid-State Circuits; 2008; pp. 292-299; vol. 43, No. 1.

Masaki Nakamura et el.; "The Phase Relations in the In2O3-Ga2ZnO4-ZnO System at 1350° C"; Journal of Solid State Chemistry; Aug. 1, 1991; pp. 298-315; vol. 93, No. 2.

Hiroshi Kanno et al.; "White Stacked Electrophosphorescent Organic Light-Emitting Devices Employing MoO3 as a Charge-Generation Layer**"; Advanced Materials; 2006; pp. 339-342: vol. 18, No. 3.

Noboru Kimizuka et al.; "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3-ZnGa2O4-ZnO System"; Journal of Solid State Chemistry; Apr. 1, 1995; pp. 170-178; vol. 116, No. 1.

Noboru Kimizuka et al.; "Spinel,YbFe2O4, and Yb2Fe3O7 Types of Structures for Compounds in the In2O3 and Sc2O3-A2O3-BO Systems [A: Fe, Ga, or Al; B: Mg, Mn, Fe, Ni, Cu, or Zn] at Temperatures over 1000° C"; Journal of Solid State Chemistry; 1985; pp. 382-384; vol. 60.

Kazuhiko Tsuda et al.; "Ultra low power consumption technologies for mobile TFT-LCDs"; IDW '02 : Proceedings of the 9th International Display Workshops; Dec. 4, 2002; pp. 295-298.

H.N. Lee et al.; "Current Status of, Chellenges to, and Perspective View of AM-OLED"; IDW '06 : Proceedings of the 13th International Display Workshops; Dec. 7, 2006; pp. 663-666.

Yasushi Asaoka et al.; "29.1: Polarizer-free Reflective LCD Combined with Ultra Low-power Driving Technology"; SID Digest '09 : SID International Symposium Digest of Technical Papers; 2009; pp. 395-398.

Kenji Nomura et al.; "Room-temperature fabrication of transparent flexible thin-film transistors using amorphous oxide semiconductors"; Nature; Nov. 25, 2004; pp. 488-492; vol. 432.

Jin-Seong Park et al.; "Improvements in the devide characteristics of amorphous indium galliuM zinc oxide thin-film transistors by Ar plasma treatment"; Applied Physics Letters; Jun. 26, 2007; pp. 262106-1-262106-3; vol. 90, No. 26.

M. Takahashi et al.; "Theotetical Analysis of IGZO Transparent Amorphous Oxide Semiconductor"; IDW '08 : Proceedings of the 15th International Display Workshops; Dec. 3, 2008; pp. 1637-1640.

Ryo Hayashi et al.; "42.1: Invited Paper: Improved Amorphous In-Ga-Zn-O TFTs"; SID Digest '08 : SID International Symposium Digest of Technical Papers; May 20, 2008; pp. 621-624; vol. 39.

Satoshi Masuda et al.; "Transparent thin film transistors using ZnO as an active channel layer and their electrical properties"; Journal of Applied Physics; Feb. 1, 2003; pp. 1624-1630; vol. 93, No. 3.

Kyoung-Seok Son et al.; "42.4L: Late-News Paper: 4 inch QVGA AMOLED Driven by the Threshold Voltage Controlled Amorphous GIZO (Ga2O3-In2O3-ZnO) TFT"; SID Digest '08 : SID International Symposium Digest of Technical Papers; May 20, 2008; pp. 633-636; vol. 39.

Kenji Nomura et al.; "Carrier transport in transparent oxide semiconductor with intrinsic structural randomness probed using single-crystalline InGaO3(ZnO)5 films"; Applied Physics Letters; Sep. 13, 2004; pp. 1993-1195; vol. 85, No. 11.

Takeshi Osada et al.; "15.2: Development of Driver-Integrated Panel using Amorphous In-Ga-Zn-Oxide TFT"; SID Digest '09 : SID International Symposium Digest of Technical Papers; May 31, 2009; pp. 184-187.

Takeshi Osada.T et al.; "Development of Driver-Integrated Panel Using Amorphous In-Ga-Zn-Oxide TFT"; AM-FPD 09 Digest of Technical Papers; Jul. 1, 2009; pp. 33-36.

Hiromichi Godo et al.; "Temperature Depenedence of Characteristics and Electronic Structure for Amorphous In-Ga-Zn-Oxide TFT"; AM-FPD '09 Digest of Technical Papers; Jul. 1, 2009; pp. 41-44.

Junichiro Sakata et al.;"Development of 4.0-in. AMOLED Display with Driver Circuit using Amorphous In-Ga-Zn-Oxide TFTS"; IDW '09 : Proceedings of the 16th International Display Workshops; 2009; pp. 689-692.

Hiromichi Godo et al.; "P-9: Numerical Analysis on Temperature Dependence of Characteristics of Amorphous In-Ga-Zn-Oxide TFT"; SID Digest '09 : SID International Symposium Digest of Technical Papers; May 31, 2009; pp. 1110-1112.

Hiroki Ohara et al.; "Amorphous In-Ga-Zn-Oxide TFTs with Suppressed Variation for 4.0 inch QVGA AMOLED Display"; AM-FPD '09 Digest of Technical Papers; The Japan Society of Applied Physics; Jul. 1, 2009, pp. 227-230.

Chris G. Van De Walle; Hydrogen as a Cause of Doping in Zinc Oxide; Physical Review Letters; Jul. 31, 2000; pp. 1012-1015; vol. 85, No. 5.

T.C. Fung et al.; "2-D Numerical Simulation of High Performance Amorphous In-Ga-Zn-O TFTs for Flat Panel Displays"; AM-FPD '08 Digest of Technical Papers; The Japan Society of Applied Physics; Jul. 2, 2008; pp. 251-252.

International Search Report, PCT Application No. PCT/JP2010/067495, dated Nov. 16, 2010, 4 pages.

Written Opinion, PCT Application No. PCT/JP2010/067495, dated Nov. 16, 2010, 5 pages.

Anderson Janotti et al.; "Oxygen vacancies in ZnO"; Applied Physics Letters; 2005; pp. 122102-1-122102-3; , vol. 87.

Hsing-Hung Hsieh et al.; "P-29: Modeling of Amorphous Oxide Semiconductor Thin Film Transistors and Subgap Density of States"; SID Digest '08 : SID International Symposium Digest of Technical Papers; 2008; pp. 1277-1280; vol. 39.

Sang-Hee Ko Park et al.; "42.3: Transparent ZnO Thin Film Transistor for the Application of High Aperture Ratio Bottom Emission AM-OLED Display"; SID Digest '08 : SID International Symposium Digest of Technical Papers; May 20, 2008; pp. 629-632; vol. 39.

Jin-Seong Park et al.; "Electronic transport properties of amorphous indium-gallium-zinc oxide semiconductor upon exposure to water"; Applied Physics Letters; 2008; pp. 072104-1-072104-3; vol. 92.

Kenji Nomura et al.; "Amorphous Oxide Semiconductors for High-Performance Flexible Thin-Film Transistors"; Japanese Journal of Applied Physics; 2006; pp. 4303-4308; vol. 45, No. 5B.

Stephan Lany et al.; "Dopability, Intrinsic Conductivity, and Nonstoichiometry of Transparent Conducting Oxides"; Physical Review Letters; Jan. 26, 2007; pp. 045501-1-045501-4; vol. 98.

J.S. Park et al.; "Dry etching of ZnO films and plasma-induced damage to optical properties"; Journal of Vacuum Science & Technology B; Mar. 1, 2003; pp. 800-803; vol. 21, No. 2.

K. Ueno et al.; "Field-effect transistor on SrTiO3 with sputtered Al2O3 gate insulator"; Applied Physics Letters; Sep. 1, 2003; pp. 1755-1757; vol. 83, No. 9.

M. Orita et al.; "Amorphous transparent conductive oxide InGaO3(ZnO)m (m<4): a Zn4s conductor"; Philosophical Magazine B; 2001; pp. 501-515; , vol. 81, No. 5.

Hideo Hosono et al.; "Working hypothesis to explore novel wide band gap electrically conducting amorphous oxides and examples"; Journal of Non-Crystalline Solids; 1996; pp. 165-169; vol. 198-200.

Yeon-Gon Mo et al.; "Amorphous Oxide TFT Backplanes for Large Size AMOLED Displays"; IDW '08 : Proceedings of the 6th International Display Workshops; Dec. 3, 2008; pp. 581-584.

Masaki Nakamura; "Synthesis of Homologous Compound with New Long-Period Structure"; Nirim Newsletter; Mar. 1, 1995; pp. 1-4; vol. 150 [with English translation].

Hiroki Ohara et al.; "21.3: 4.0 in. QVGA AMOLED Display using In-Ga-Zn-Oxide TFTS with a Novel Passivation Layer"; SID Digest '09 : SID International Symposium Digest of Technical Papers; May 31, 2009; pp. 284-287.

Min Suk Oh et al.; "Improving the Gate Stability of ZnO Thin-Film Transistors with Aluminum Oxide Dielectric Layers"; Journal of the Electrochemical Society; 2008; pp. H1009-H1014; vol. 155, No. 12.

Anderson Janotti et al.; "Native point defects in ZnO"; Physical Review B; 2007; pp. 165202-1-165202-22; vol. 76.

Stewart J. Clark et al.; "First principles methods using CASTEP"; Zeitschrift fur Kristallographie; 2005; pp. 567-570; , vol. 220.

J.S. Park et al.; "Dry etching of ZnO films and plasma-induced damage to optical properties"; Journal of Vacuum Science & Technology B; Mar. 1, 2003; pp. 800-803; , vol. 21, No. 2.

Sangwook Kim et al.; "High-performance oxide thin film transistors passivated by various gas plasmas"; 214th ECS Meeting; 2008, No. 2317.

Fumiyasu Oba et al.; "Defect energetics in ZnO: A hybrid Hartree-Fock density functional study"; Physical Review B; 2008; pp. 245202-1-245202-6; vol. 77.

Masahiro Orita et al.; "Mechanism of electrical conductivity of transparent InGaZnO4"; Physical Review B; Jan. 15, 2000; pp. 1811-1816; , vol. 61, No. 3.

* cited by examiner

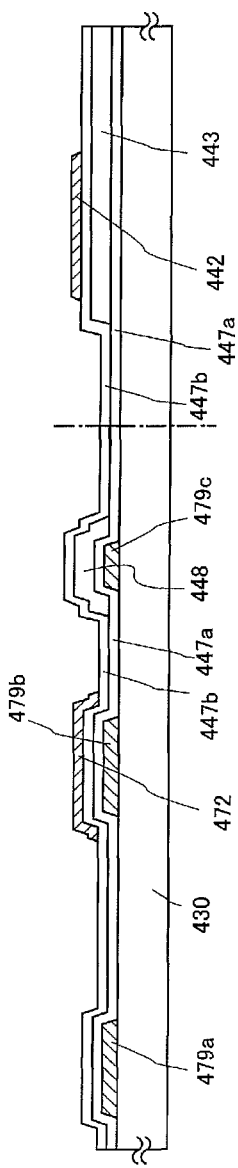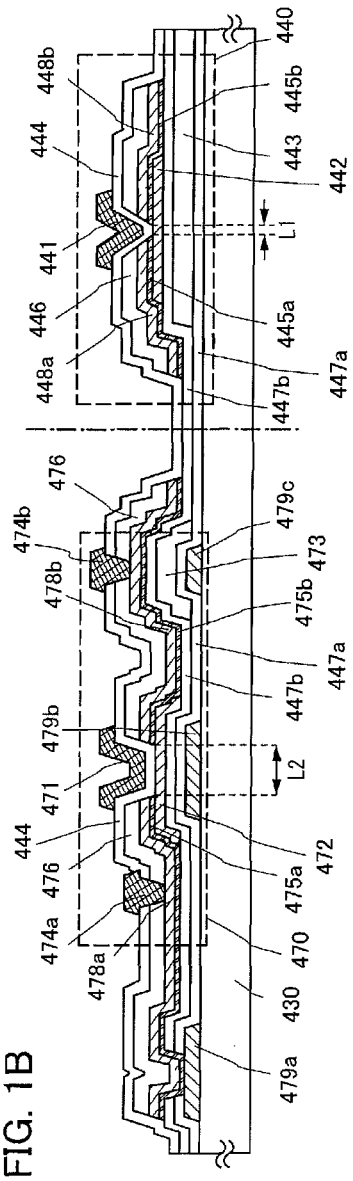
FIG. 1A
FIG. 1B

SEMICONDUCTOR DEVICE AND MANUFACTURING METHOD THEREOF

TECHNICAL FIELD

The present invention relates to a semiconductor device including an integrated circuit which includes a thin film transistor (hereinafter, referred to as a TFT) and a manufacturing method thereof. For example, the present invention relates to an electronic device on which a semiconductor integrated circuit is mounted as a component.

In this specification, a "semiconductor device" generally refers to a device which can function by utilizing semiconductor characteristics; an electro-optical device, a semiconductor circuit, an electronic component, and an electronic device are all included in semiconductor devices.

BACKGROUND ART

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

In addition, a semiconductor device capable of transmitting and receiving data has been developed. Such a semiconductor device is called a wireless tag, an RFID tag, or the like. Those put into practical use include a semiconductor circuit (IC chip) formed using an antenna and a semiconductor substrate in many cases.

A silicon-based semiconductor material has been known as a semiconductor thin film which can be applied to a thin film transistor; however, an oxide semiconductor is attracting attention as another material. As a material of the oxide semiconductor, zinc oxide or a material including zinc oxide as its component is known. In addition, a thin film transistor including an amorphous oxide (oxide semiconductor) whose electron carrier concentration is lower than $10^{18}/cm^3$ is disclosed (Patent Documents 1 to 3).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

Power consumption of electronic devices in a standby period is regarded as important in addition to power consumption in an operating period. Specifically, as for portable electronic devices, to which power is supplied from battery, time of use is limited due to limited amount of electric power. Further, as for in-vehicle electronic devices, when leakage current in a standby period is large, lifetime of battery may be reduced. In the case of an electric vehicle, leakage current of the in-vehicle electronic device shortens the traveling distance per a certain amount of charging.

In order to reduce power consumption, reducing leakage current in a standby period in addition to power consumption in an operating period is effective. Although the amount of leakage current of each transistor is not large, several millions of transistors are provided in the LSI, and when the amount of leakage current of those transistors is added up, the resulting amount is by no means small. Such leakage current causes an increase in power consumption of the semiconductor device in a standby period. Although leakage current is caused by various factors, electric power can be saved in a driver circuit or the like which is used in electronic devices, if leakage current in a standby period can be reduced.

Therefore, an object of the present invention is to reduce leakage current of a transistor used for an LSI, a CPU, or a memory.

Reduction in parasitic capacitance is also effective for reduction in power consumption in an operating period; therefore, another object of the present invention is to reduce power consumption by reducing parasitic capacitance.

In addition, another object of the present invention is to shorten the channel length L of a transistor used in a semiconductor integrated circuit such as an LSI, a CPU, or a memory, so that operation speed of the circuit is increased, and further, power consumption is reduced.

A semiconductor integrated circuit such as an LSI, a CPU, or a memory is manufactured using a thin film transistor in which a channel formation region is formed using an oxide semiconductor which becomes an intrinsic or substantially intrinsic semiconductor by removing impurities which serve as electron donors (donors) from the oxide semiconductor and has larger energy gap than that of a silicon semiconductor.

A highly purified oxide semiconductor layer with sufficiently reduced hydrogen concentration, in which impurities such as hydrogen or OH group contained are removed so that the hydrogen concentration is lower than or equal to $5\times10^{19}/cm^3$, preferably lower than or equal to $5\times10^{18}/cm^3$ or, more preferably lower than or equal to $5\times10^{17}/cm^3$, is used for a thin film transistor, whereby an off-current of the thin film transistor is reduced. Note that the concentration of hydrogen in the oxide semiconductor layer is measured by secondary ion mass spectrometry (SIMS).

It is preferable that when the gate voltage Vg is positive, a drain current Id be sufficiently large, and when the gate voltage Vg is less than or equal to zero, the drain current Id be zero. In a thin film transistor using the highly purified oxide semiconductor layer with sufficiently reduced hydrogen concentration, in the case where a drain voltage Vd is +IV or +10V, an off-current value can be smaller than $1\times10^{-13}$ [A] while the gate voltage Vg is in the range of -5V to -20V.

By using the thin film transistor using the highly purified oxide semiconductor layer with sufficiently reduced hydrogen concentration, a semiconductor device whose power consumption due to leakage current is low can be realized.

The thin film transistor using the highly purified oxide semiconductor layer with sufficiently reduced hydrogen concentration can be formed over a glass substrate, and an LSI, a CPU, or a memory can be formed thereover. By using a large-area glass substrate, manufacturing cost can be reduced. Without being limited to a glass substrate, the thin film transistor using the oxide semiconductor layer with sufficiently reduced hydrogen concentration can be formed over a silicon substrate. A silicon substrate with high thermal conductivity is preferably used to dissipate heat from the semiconductor circuit. Alternatively, the thin film transistor using the oxide semiconductor layer with sufficiently reduced hydrogen concentration can be formed over a flexible substrate, for example, a plastic film, whereby a flexible wireless tag can be manufactured.

One of the structures of the invention disclosed in this specification is a semiconductor device provided with a semiconductor integrated circuit including a plurality of thin film transistors including; an oxide semiconductor layer over an insulating surface, whose hydrogen concentration measured by secondary ion mass spectrometry is lower than or equal to $5 \times 10^{19}/cm^3$ and carrier concentration is lower than or equal to $5 \times 10^{14}/cm^3$, a source and drain electrode layers over the oxide semiconductor layer, a gate insulating layer over the oxide semiconductor layer and the source and drain electrode layers, and a gate electrode layer over the gate insulating layer.

With the above structure, at least one of the above problems can be resolved.

In addition, a conductive layer may be formed below the oxide semiconductor layer. Thus, another structure of the invention is a semiconductor device including a plurality of thin film transistors including; a conductive layer over an insulating surface, an insulating layer over the conductive layer, an oxide semiconductor layer over the insulating layer, whose hydrogen concentration measured by secondary ion mass spectrometry is lower than or equal to $5 \times 10^{19}/cm^3$ and carrier concentration is lower than or equal to $5 \times 10^{14}/cm^3$, a source and drain electrode layers over the oxide semiconductor layer, a gate insulating layer over the oxide semiconductor layer and the source and drain electrode layers, and a gate electrode layer over the gate insulating layer, wherein the conductive layer overlaps with the oxide semiconductor layer with the insulating layer interposed therebetween.

In order to reduce parasitic capacitance, each of the above structures further include an insulating layer over and in contact with the source and drain electrode layers, so that the source and drain electrode layers overlap with part of the gate electrode layer with the gate insulating layer and the insulating layer interposed therebetween. By providing the insulating layer over and in contact with the source and drain electrode layers, parasitic capacitance between the gate electrode layer and the source electrode layer and between the gate electrode layer and the drain electrode layer can be reduced.

Further, in a wiring intersection portion, in order to reduce the parasitic capacitance, the gate insulating layer and the insulating layer are stacked between a gate wiring layer and a source wiring layer. An increase in the distance between the gate wiring layer and the source wiring layer can reduce power consumption due to parasitic capacitance, and can prevent short circuit between wirings.

Further, an EDMOS circuit can be formed by combining a plurality of thin film transistors using an oxide semiconductor layer with sufficiently reduced hydrogen concentration. Such an EDMOS circuit includes a first thin film transistor including a first oxide semiconductor layer and a second thin film transistor including a second oxide semiconductor layer over an insulating surface, wherein the hydrogen concentration of the first oxide semiconductor layer and the second semiconductor layer measured by secondary ion mass spectrometry is lower than or equal to $5 \times 10^{19}/cm^3$ and the carrier concentration thereof is lower than or equal to $5 \times 10^{14}/cm^3$.

A resistor, a capacitor, an inductor, and the like can be formed over one substrate by using the oxide semiconductor layer with sufficiently reduced hydrogen concentration. For example, the resistor can be formed by sandwiching the oxide semiconductor layer with sufficiently reduced hydrogen concentration between upper and lower electrode layers. In each of the above structures, an oxide semiconductor layer which serves as a resistor is formed over the same substrate, between a first conductive layer and a second conductive layer overlapping with the first conductive layer.

In addition to an LSI, a CPU, or a memory, the thin film transistor using the oxide semiconductor layer with sufficiently reduced hydrogen concentration can be used for a power supply circuit, a transmitting and receiving circuit, an amplifier of an audio processing circuit, a driver circuit of a display portion, a controller, a converter of an audio processing circuit, or the like.

Alternatively, a plurality of semiconductor integrated circuits can be mounted on one package, which is a so-called MCP (Multi Chip Package), so that the semiconductor device is highly integrated.

In the case where the semiconductor integrated circuit is mounted on a circuit board, the semiconductor integrated circuit may be mounted in a face-up state or a flip-chip state (face-down state).

A thin film transistor using the oxide semiconductor layer with sufficiently reduced hydrogen concentration can extremely reduce leakage current, and a semiconductor device with low power consumption can be realized by using the thin film transistor for a semiconductor integrated circuit.

BRIEF DESCRIPTION OF DRAWINGS

FIGS. 1A and 1B are cross-sectional views illustrating one embodiment of the present invention.

BEST MODE FOR CARRYING OUT THE INVENTION

Figure 2:
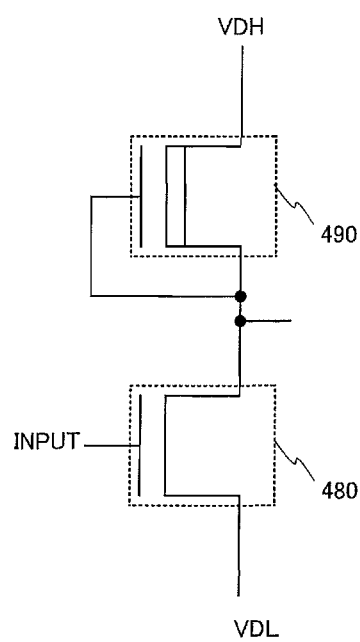
FIG. 2 is an equivalent circuit diagram illustrating one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

This embodiment describes an example of a cross-sectional structure of a semiconductor integrated circuit.

In this embodiment, one embodiment of a semiconductor integrated circuit and a manufacturing method thereof is described with reference to FIGS. 1A and 1B, FIG. 2, FIG. 3, and FIGS. 4A and 4B.

An example of a cross-sectional structure of the semiconductor integrated circuit is illustrated in FIGS. 1A and 1B. A thin film transistor 440 illustrated in FIG. 1B is one of top-gate thin film transistors.

The thin film transistor 440 includes a first insulating layer 447a, a second insulating layer 443, a third insulating layer 447b, an oxide semiconductor layer 442, a first source electrode layer 445a, a second source electrode layer 448a, a first drain electrode layer 445b, a second drain electrode layer 448b, a gate insulating layer 444, and a gate electrode layer 441, over a substrate 430 having an insulating surface.

Part of the oxide semiconductor layer 442 which overlaps with the gate electrode layer 441 is a channel formation region, and a channel length L1 is determined by the distance between the lower edge portion of the first source electrode layer 445a and the lower edge portion of the first drain electrode layer 445b which are next to each other over the oxide semiconductor layer 442.

The thin film transistor 440 is described using a single-gate thin film transistor; however, a thin film transistor having a multi-gate structure in which a plurality of channel formation regions is included can also be used as needed.

A thin film transistor 470 with reduced parasitic capacitance can be formed over the same substrate and in the same steps as the thin film transistor 440.

Hereinafter, steps for manufacturing the thin film transistors 440 and 470 over the substrate 430 will be described below with reference to FIG. 1A.

Although there is no particular limitation on a substrate which can be used as the substrate 430 having an insulating surface, the substrate needs to have at least heat resistance high enough to withstand heat treatment to be performed later. As the substrate 430 having an insulating surface, a glass substrate formed of barium borosilicate glass, alumino-borosilicate glass, or the like can be used.

In the case where a glass substrate is used and the temperature at which the heat treatment is to be performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than that of boric oxide ($B_2O_3$), a glass substrate is heat-resistant and of more practical use. Therefore, a glass substrate containing a larger amount of BaO than that of $B_2O_3$ is preferably used.

Note that instead of the above glass substrate, a substrate formed of an insulator such as a ceramic substrate, a quartz substrate, or a sapphire substrate may be used. Alternatively, a crystallized glass substrate or the like may be used. Alternatively, a semiconductor substrate including an insulating layer on its surface, a plastic substrate, or the like can be used as appropriate.

First, after a conductive film is formed over the substrate 430 having an insulating surface, electrode layers 479a, 479b and 479c are formed by a first photolithography step. The electrode layers 479a, 479b and 479c can be formed using an element selected from Al, Cr, Cu, Ta, Ti, Mo, and W, an alloy containing any of these elements, an alloy film containing a combination of any of these elements, or the like. In this embodiment, the electrode layers 479a, 479b and 479c have a stacked layer structure of a tungsten nitride layer and a tungsten layer.

Next, the first insulating layer 447a is formed to cover the electrode layers 479a, 479b and 479c. The first insulating layer 447a can be formed using a single-layer or stacked layers of a silicon oxide layer, a silicon nitride layer, a silicon oxynitride layer, and/or a silicon nitride oxide layer by a plasma CVD method, a sputtering method, or the like.

Next, a spacer insulating layer is formed over the first insulating layer 447a, and is selectively removed then by a second photolithography step to form the second insulating layer 443. The spacer insulating layer is formed using a single layer or stacked layers of a silicon oxide layer, a silicon nitride layer, a silicon oxynitride layer, and/or a silicon nitride oxide layer by a plasma CVD method, a sputtering method, or the like. The thickness of the spacer insulating layer is 500 nm to 2 μm, inclusive. In the same step, a fifth insulating layer 473 functioning as a spacer insulating layer is formed so as to overlap with the electrode layer 479c. In this manner, a stacked layer region with large thickness and a single layer region with small thickness are formed. In order to reduce parasitic capacitance, the fourth insulating layer functioning as a spacer insulating layer and the first insulating layer are stacked in the region with large thickness, and in order to form a storage capacitor and the like, the first insulating layer is provided in the region with small thickness.

Next, the third insulating layer 4476 is formed to cover the first insulating layer 447a, the second insulating layer 443, and the fifth insulating layer 473. The third insulating layer 4476 which is in contact with the oxide semiconductor layer is preferably formed using an oxide insulating layer such as a silicon oxide layer, a silicon oxynitride layer, an aluminum oxide layer, or an aluminum oxynitride layer. As a method for forming the third insulating layer 447b, a plasma CVD method, a sputtering method, or the like can be used; however, it is preferable that the third insulating layer 447b be formed by a sputtering method, so that the third insulating layer 447b does not contain a large amount of hydrogen.

In this embodiment, a silicon oxide layer is formed as the third insulating layer 447b by a sputtering method. The substrate 430 is transferred to a treatment chamber, a sputtering gas including highly purified oxygen from which hydrogen and moisture are removed is introduced thereinto, and a silicon oxide layer is formed over the substrate 430 as the third insulating layer 4476 using a silicon target. The temperature of the substrate 430 may be room temperature, or the substrate 430 may be heated.

For example, a silicon oxide layer is formed by an RF sputtering method using quartz (preferably, synthetic quartz) in an atmosphere containing oxygen and argon (the flow rate of oxygen is 25 sccm, and the flow rate of argon is 25 sccm), under conditions where a substrate temperature is 108° C., the distance between the substrate and the target (T-S distance) is 60 mm, the pressure is 0.4 Pa, and a high-frequency power source is 1.5 kW. The thickness of the layer is 100 nm. Note that instead of quartz (preferably, synthetic quartz), a silicon target can be used as a target for deposition of the silicon oxide layer. As the sputtering gas, oxygen or a mixed gas of oxygen and argon is used.

In this case, it is preferable that the third insulating layer 447b be formed while moisture remaining in the treatment chamber is removed. This is so that the third insulating layer 447b does not contain hydrogen, hydroxyl, or moisture.

In order to remove moisture remaining in the treatment chamber, an adsorption type vacuum pump is preferably used. For example, a cryopump, an ion pump, or a titanium sublimation pump is preferably used. As an evacuation unit, a turbo pump provided with a cold trap may be used. In a treatment chamber which is evacuated using a cryopump, for example, hydrogen atoms, compounds including hydrogen atoms such as water ($H_2O$), or the like are exhausted; thus, the concentration of impurities contained in the third insulating layer 447b which is deposited in the treatment chamber can be reduced.

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method using sputtering, there are also a reactive sputtering method in which a target substance and a sputtering gas component are chemically reacted with each other during deposition to form a thin compound film thereof, and a bias sputtering in which a voltage is also applied to a substrate during deposition.

The third insulating layer 447b can also have a stacked layer structure. For example, a nitride insulating layer such as a silicon nitride layer, a silicon nitride oxide layer, or an aluminum nitride layer, and the above-described oxide insulating layer may be stacked in this order from the substrate 430 side.

For example, a sputtering gas including high-purified nitrogen from which hydrogen and moisture are removed is introduced between the silicon oxide layer and the substrate to form a silicon nitride layer using a silicon target. In this case, it is preferable that the silicon nitride layer be formed while moisture remaining in the treatment chamber is removed, in a manner similar to that of the silicon oxide layer.

Also in the case of forming the silicon nitride layer, the substrate may be heated at the time of deposition.

In the case where the silicon nitride layer and the silicon oxide layer are stacked as the third insulating layer 447b, the silicon nitride layer and the silicon oxide layer can be formed in one treatment chamber using the same silicon target. First, a sputtering gas including nitrogen is introduced into the treatment chamber, and the silicon nitride layer is formed using a silicon target provided in the treatment chamber. Then, the sputtering gas is switched to a sputtering gas including oxygen, and the silicon oxide layer is formed using the same silicon target. The silicon nitride layer and the silicon oxide layer can be formed in succession without being exposed to air, thereby preventing impurities such as hydrogen or moisture from being adsorbed onto a surface of the silicon nitride layer.

Then, an oxide semiconductor film is formed to a thickness of greater than or equal to 2 nm and less than or equal to 200 nm over the third insulating layer 447b.

In addition, in order that hydrogen, hydroxyl, and moisture are contained as little as possible in the oxide semiconductor film, it is preferable that the substrate 430 over which the third insulating layer 447b is formed be preheated in a preheating chamber of the sputtering apparatus, so that impurities such as hydrogen or moisture absorbed onto the substrate 430 are discharged and exhausted, as a pretreatment before deposition. Note that as an evacuation, a cryopump is preferably provided in the preheating chamber. Note also that this preheating treatment can be omitted in some cases.

Note that before the oxide semiconductor film is formed by a sputtering method, dust on a surface of the third insulating layer 447b is preferably removed by reverse sputtering in which an argon gas is introduced and plasma is generated. The reverse sputtering is a method in which voltage is applied to a substrate side without applying voltage to a target side, using a high-frequency power source to generate plasma in the vicinity of the substrate side in an argon atmosphere, so that a surface is modified. Note that instead of an argon atmosphere, a nitrogen atmosphere, a helium atmosphere, an oxygen atmosphere, or the like may be used.

The oxide semiconductor film is formed by a sputtering method. Any of the following is used as the oxide semiconductor film: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film. In this embodiment, the oxide semiconductor film is formed by a sputtering method with the use of a target for formation of an In—Ga—Zn—O-based oxide semiconductor film. The oxide semiconductor film can be formed by a sputtering method in a rare gas (typically, argon) atmosphere, an oxygen atmosphere, or a mixed atmosphere including a rare gas (typically, argon) and oxygen. In the case of using a sputtering method, a target including $SiO_2$ at 2 wt % to 10 wt % inclusive may be used for deposition.

As a target for forming the oxide semiconductor film by a sputtering method, a target of metal oxide which contains zinc oxide as its main component can be used. As another example of a target of metal oxide, an oxide semiconductor target for film formation including In, Ga, and Zn (composition ratio is $In_2O_3:Ga_2O_3:ZnO=1:1:1$ [molar ratio]) can be used. As an oxide semiconductor target for film formation including In, Ga, and Zn, a target having a composition ratio of $In_2O_3:Ga_2O_3:ZnO=1:1:2$ [molar ratio], or $In_2O_3:Ga_2O_3:ZnO=1:1:4$ [molar ratio] can also be used. The filling rate of the oxide semiconductor target for film formation is 90% to 100% inclusive, preferably, 95% to 99.9% inclusive. By using an oxide semiconductor target for film formation with high filling rate, the deposited oxide semiconductor film becomes a dense film.

The oxide semiconductor film is formed in the following manner: the substrate is held in the treatment chamber which is kept in a reduced pressure state, a sputtering gas from which hydrogen and moisture are removed is introduced into the treatment chamber while removing moisture remaining therein, and the oxide semiconductor film is formed over the substrate 430 using metal oxide as a target. In order to remove moisture remaining in the treatment chamber, an adsorption type vacuum pump is preferably used. For example, a cryopump, an ion pump, or a titanium sublimation pump is preferably used. As an evacuation unit, a turbo pump provided with a cold trap may be used. In a treatment chamber which is evacuated using a cryopump, for example, hydrogen atoms, compounds including hydrogen atoms such as water ($H_2O$) (more preferably, compounds including carbon atoms as well), or the like are exhausted; therefore, the concentration of impurities contained in the oxide semiconductor film which is deposited in the treatment chamber can be reduced. The substrate may be heated when the oxide semiconductor film is formed.

As one example of deposition conditions, conditions where a substrate temperature is room temperature, the distance between the substrate and the target is 60 mm, the pressure is 0.4 Pa, and a direct-current (DC) power source is 0.5 kW, and the atmosphere is an atmosphere of oxygen and argon (the flow rate of oxygen is 15 sccm, and the flow rate of argon is 30 sccm), are applied. It is preferable that a pulsed direct-current (DC) power supply be used because powder substances (also referred to as particles or dust) can be reduced and the film thickness can be uniform. The thickness of the oxide semiconductor film is preferably 5 nm to 30 nm, inclusive. Note that the appropriate thickness varies depending on the oxide semiconductor material used for the oxide semiconductor film, and can be selected as appropriate according to the material.

Next, the oxide semiconductor film is processed into island-shaped oxide semiconductor layers 442 and 472 in a third photolithography step (see FIG. 1A). Further, a resist mask for forming the island-shaped oxide semiconductor layers 442 and 472 may be formed using an ink jet method. Formation of the resist mask by an inkjet method needs no photomask; thus, manufacturing cost can be reduced.

Note that etching of the oxide semiconductor film here can be dry etching, wet etching, or both of dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, an ammonia peroxide mixture (31 wt % of hydrogen peroxide solution: 28 wt % of ammonia water: water=5:2:2), or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

In this embodiment, the oxide semiconductor film is processed into island-shaped oxide semiconductor layers 442 and 472, by a wet etching method using a mixed solution of phosphoric acid, acetic acid, and nitric acid as an etchant.

In this embodiment, a first heat treatment is performed on the oxide semiconductor layers 442 and 472. A temperature of the first heat treatment is 400° C. to 750° C. inclusive, preferably higher than or equal to 400° C. and lower than the strain point of the substrate. In this embodiment, the substrate is introduced into an electric furnace, which is one of heat treatment apparatuses, and heat treatment is performed at 450° C. on the oxide semiconductor layers for an hour in a nitrogen atmosphere. Then, the oxide semiconductor layers are not exposed to air, which prevents reincorporation of water and hydrogen into the oxide semiconductor layers, so that the oxide semiconductor layers are obtained. By this first heat treatment, dehydration or dehydrogenation can be performed on the oxide semiconductor layers 442 and 472.

However, the apparatus for the first heat treatment is not limited to the electric furnace and may be provided with a device for heating an object to be processed using heat conduction or heat radiation from a heating element such as a resistance heating element. For example, an RTA (rapid thermal anneal) apparatus such as a GRTA (gas rapid thermal anneal) apparatus, or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with a process object by heat treatment, such as nitrogen or a rare gas such as argon is used.

For example, as the first heat treatment, GRTA can be performed, in which the substrate is transferred and put in an inert gas heated to a high temperature of 650° C. to 700° C. to be heated for several minutes, and then, the substrate is transferred and taken out of the inert gas heated to a high temperature. By using GRTA, high-temperature heat treatment in a short time is possible.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Further, the oxide semiconductor layer may be crystallized to be a microcrystalline film or a polycrystalline film depending on a condition of the first heat treatment or a material of the oxide semiconductor layer. For instance, the oxide semiconductor layer may be crystallized to be a microcrystalline semiconductor film having a degree of crystallization of 90% or more, or 80% or more. Further, depending on the condition of the first heat treatment and the material of the oxide semiconductor layer, the oxide semiconductor layer may be an amorphous oxide semiconductor film containing no crystalline component. The oxide semiconductor layer may be an oxide semiconductor film in which microcrystalline portions (each crystal grain having a diameter of 1 nm to 20 nm inclusive (typically, 2 nm to 4 nm inclusive)) are included in an amorphous oxide semiconductor in some cases.

The first heat treatment for the oxide semiconductor layer can be performed before the oxide semiconductor film is processed into the island-shaped oxide semiconductor layers. In that case, the substrate is taken out from the heat apparatus after the first heat treatment, and then a photolithography step is performed.

The heat treatment having an effect of dehydration or dehydrogenation of the oxide semiconductor layers may be performed at any of the following timings: after the oxide semiconductor layers are formed; after a source electrode and a drain electrode are formed over the oxide semiconductor layer; and after a gate insulating layer is formed over the source electrode and the drain electrode.

However, when a highly purified oxide semiconductor layer can be obtained by sufficiently reducing hydrogen or moisture at the time of deposition, the first heat treatment is not necessarily performed. In the case where a highly purified oxide semiconductor layer is obtained by sufficiently reducing hydrogen or moisture at the time of deposition, the substrate is held in a treatment chamber kept in a reduced pressure state and the substrate is heated to a temperature of higher than or equal to room temperature and lower than 400° C. Then, a sputtering gas from which hydrogen and moisture are removed is introduced while moisture remaining in the treatment chamber is removed, and an oxide semiconductor layer is formed over the substrate using metal oxide as a target. In a treatment chamber which is evacuated using a cryopump, for example, hydrogen atoms, compounds including hydrogen atoms such as water ($H_2O$) (more preferably, compounds including carbon atoms in addition), or the like are exhausted; therefore, the concentration of impurities contained in the oxide semiconductor layer deposited in the treatment chamber can be reduced. By performing deposition by sputtering while removing moisture remaining in the treatment chamber using a cryopump, a substrate temperature when the oxide semiconductor layer is formed can be higher than or equal to room temperature and lower than 400° C.

Next, a resist mask is formed over the third insulating layer 447b by a fourth photolithography step, and selective etching is performed so as to form an opening which reaches the electrode layer 479a.

A conductive film is formed over the third insulating layer 447b and the oxide semiconductor layers 442 and 472. The conductive film may be formed by a sputtering method or a vacuum evaporation method. As a material of the conductive film, an element selected from Al, Cr, Cu, Ta, Ti, Mo, and W; an alloy containing any of these elements as a component; an alloy film containing any of these elements in combination; and the like can be given. Alternatively, one or more materials selected from manganese, magnesium, zirconium, beryllium, and thorium can be used. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc). In this embodiment, a stacked film of a titanium film (with a thickness of 10 nm to 100 nm inclusive) and an aluminum film (with a thickness of 20 nm to 500 nm inclusive) is formed as the conductive film.

Next, an insulating film with a thickness of 200 nm to 2000 nm inclusive is formed over the conductive film by a plasma CVD method, a sputtering method, or the like, using a single layer or stacked layers of a silicon oxide layer, a silicon nitride layer, a silicon oxynitride layer, and/or a silicon nitride oxide layer.

A resist mask is formed over the insulating film by a fifth photolithography step, selective etching is performed to form the fourth insulating layer 446, the first source electrode layer 445a, the second source electrode layer 448a, the first drain electrode layer 445b, and the second drain electrode layer 448b, and then the resist mask is removed. The fourth insulating layer 446 is provided in order to reduce parasitic capacitance between the gate electrode layer formed later and the source and drain electrode layers. Note that it is preferable that the end portions of the source electrode layers and the drain electrode layers be a tapered shape because coverage of the gate insulating layer stacked thereover is improved.

Note that when the conductive film is etched, each material and etching conditions are adjusted as appropriate so that the oxide semiconductor layers 442 and 472 are not removed so as to expose the third insulating layer 447b thereunder.

In this embodiment, a Ti film is used as the first source electrode layer 445a and the first drain electrode layer 445b, an aluminum film is used as the second source electrode layer 448a and the second drain electrode layer 448b, an In—Ga—Zn—O-based oxide is used as the oxide semiconductor layer 442, and an ammonia hydrogen peroxide mixture (a mixed solution of ammonia water, water, and a hydrogen peroxide solution) is used as the etchant.

Note that in the fifth photolithography step, only part of the oxide semiconductor layer 442 may be etched so that an oxide semiconductor layer having a groove (a depression portion) is formed in some cases. The resist mask for forming the first source electrode layer 445a and the first drain electrode layer 445b may be formed by an ink jet method. Formation of the resist mask by an inkjet method needs no photomask; thus, manufacturing cost can be reduced.

In light exposure for formation of the resist mask in the fifth photolithography step, ultraviolet light, KrF laser light, or ArF laser light is used. A channel length L1 of the thin film transistor 440 formed later is determined by the distance between the lower edge portion of the source electrode layer and the lower edge portion of the drain electrode layer which are next to each other over the oxide semiconductor layer 442. In the case of performing light exposure by which the channel length L1 is shorter than 25 nm, light exposure for forming the resist mask in the fifth photolithography step is performed using extreme ultraviolet light with extremely short wavelength of several nanometers to several tens of nanometers. In light exposure using extreme ultraviolet, resolution is high and depth of focus is large. Therefore, the channel length L1 of the thin film transistor 440 formed later can be 10 nm to 1000 nm inclusive, operation speed of the circuit can be increased, and power consumption can be reduced because an off-current value is extremely small.

Next, the gate insulating layer 444 is formed over the fourth insulating layer 446, the oxide semiconductor layers 442 and 472, the first source electrode layer 445a, the second source electrode layer 448a, the first drain electrode layer 445b, and the second drain electrode layer 448b.

The gate insulating layer 444 can be formed to have a single-layer structure or a stacked-layer structure of a silicon oxide layer, a silicon nitride layer, a silicon oxynitride layer, a silicon nitride oxide layer, or an aluminum oxide layer by a plasma CVD method, a sputtering method, or the like. Note that the gate insulating layer 444 is preferably formed by a sputtering method so that the gate insulating layer 444 does not contain a large amount of hydrogen. In the case where a silicon oxide film is formed by a sputtering method, a silicon target or a quartz target is used as a target, and an oxygen gas or a mixed gas of oxygen and argon is used as a sputtering gas.

The gate insulating layer 444 can have a structure in which a silicon oxide layer and a silicon nitride layer are stacked in this order from the side of the second source electrode layer 448a and the second drain electrode layer 448b. For example, a silicon oxide layer ($SiO_x$ (x>0)) with a thickness of 5 nm to 300 nm inclusive is formed as the first gate insulating layer, a silicon nitride layer ($SiO_y$ (y>0)) with a thickness of 50 nm to 200 nm inclusive is stacked as the second gate insulating layer over the first gate insulating layer by a sputtering method, to form a gate insulating layer with a thickness of 100 nm. In this embodiment, a silicon oxide layer with a thickness of 100 nm is formed by an RF sputtering method in an atmosphere containing oxygen and argon (the flow rate of oxygen is 25 sccm, and the flow rate of argon is 25 sccm), under conditions where the pressure is 0.4 Pa, and a high-frequency power source is 1.5 kW.

Next, a resist mask is formed by a sixth photolithography step, selective etching is performed so as to remove part of the gate insulating layer 444 and the fourth insulating layer 446, and an opening is formed to reach the source electrode layer or the drain electrode layer of the thin film transistor 470.

Then, a conductive film is formed over the gate insulating layer 444 and the opening, and gate electrode layers 441 and 471 and wiring layers 474a and 474b are formed by a seventh photolithography step. Note that a resist mask may be formed by an inkjet method. Formation of the resist mask by an inkjet method needs no photomask; thus, manufacturing cost can be reduced.

The gate electrode layers 441 and 471 and the wiring layers 474a and 474b can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layers 441 and 471 and the wiring layers 474a and 474b, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that a gate electrode layer can be formed using a conductive film having a light-transmitting property. As an example of a conductive film having a light-transmitting property, a transparent conductive oxide or the like can be given.

In this embodiment, a tungsten film with a thickness of 150 nm is formed as the gate insulating layers 441 and 471 and the wiring layers 474a and 474b.

Next, a second heat treatment (preferably at a temperature of 200° C. to 400° C. inclusive, for example, 250° C. to 300° C. inclusive) is performed in an inert gas atmosphere or an oxygen gas atmosphere. In this embodiment, the second heat treatment is performed at 250° C. in a nitrogen atmosphere for one hour. The second heat treatment may be performed after a protective insulating layer or a planarizing insulating layer is formed over the thin film transistors 440 and 470.

Further, heat treatment may be performed at 100° C. to 200° C. inclusive for one hour to 30 hours inclusive in an air atmosphere. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed before formation of the insulating layer under a reduced pressure. Under the reduced pressure, the heat treatment time can be shortened.

Through the above steps, the thin film transistors 440 and 470 respectively including the oxide semiconductor layers 442 and 472 with a reduced concentration of hydrogen, moisture, hydride, and hydroxide can be formed (see FIG. 1B).

The thin film transistor 470 in which parasitic capacitance between the electrode layer 479c and a fourth drain electrode layer 478b is reduced by the fifth insulating layer 473 includes a third source electrode layer 475a, a fourth source electrode layer 478a, a third drain electrode layer 475b, and the fourth drain electrode layer 478b. Note that the electrode layer 479c overlapping with the fifth insulating layer 473 is a gate signal line, and describes a structure of a wiring intersection with the fourth drain electrode layer 478b. The third source electrode layer 475a is electrically connected to the electrode layer 479a. The fourth source electrode layer 478a is electrically connected to a wiring layer 474a. The thin film transistor 470 is a thin film transistor which has a channel length L2 longer than the channel length L1 of the thin film transistor 440 and a small off-current value.

In addition, a protective insulating layer or a planarizing insulating layer for planarization may be formed over the thin film transistors 440 and 470. For example, a protective insulating layer can be formed to have a single-layer or stacked-layer structure of a silicon oxide layer, a silicon nitride layer, a silicon oxynitride layer, a silicon nitride oxide layer, or an aluminum oxide layer.

The planarizing insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarizing insulating layer may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarizing insulating layer. The planarizing insulating layer can be formed, depending on the material, by a method such as a sputtering method, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater, or the like.

The electrode layer 479b provided below the oxide semiconductor layer 472 of the thin film transistor 470 can function as a back gate. A potential of the back gate can be a fixed potential, e.g., 0V, or a ground potential, and may be determined as appropriate by a practitioner. In addition, by providing the gate electrodes above and below the oxide semiconductor layer, in a bias-temperature stress test (hereinafter, referred to as a BT test) for examining reliability of the thin film transistor, the amount of shift in threshold voltage of the thin film transistor between before and after the BT test can be reduced. That is, provision of the gate electrodes above and below the oxide semiconductor layer can improve the reliability.

Further, by controlling gate voltage applied to the electrode layer 479b, threshold voltage can be determined. Alternatively, when the threshold voltage is set positive, the thin film transistor can function as an enhancement type transistor. Further alternatively, when the threshold voltage is set negative, the thin film transistor can function as a depletion type transistor.

For example, an inverter circuit including a combination of the enhancement type transistor and the depletion type transistor (hereinafter, such a circuit is referred to as an EDMOS circuit) can be used for a driver circuit. The driver circuit includes at least a logic circuit portion, and a switch portion or a buffer portion. The logic circuit portion has a circuit structure including the above EDMOS circuit. Further, a thin film transistor by which large on-state current can flow is preferably used for the switch portion or the buffer portion. A depletion type transistor or a thin film transistor including gate electrodes above and below an oxide semiconductor layer is used.

Thin film transistors having different structures can be formed over one substrate without greatly increasing the number of steps. For example, an EDMOS circuit using the thin film transistor including gate electrodes above and below the oxide semiconductor layer may be formed in an integrated circuit for high-speed driving, and a thin film transistor including a gate electrode above an oxide semiconductor layer can be formed in other regions.

Note that an n-channel TFT whose threshold voltage is positive is referred to as an enhancement type transistor, and an n-channel TFT whose threshold voltage is negative is referred to as a depletion type transistor, throughout this specification.

In the thin film transistor 470 and the thin film transistor 440, when a silicon nitride film is used for both the gate insulating layer 444 and the first insulating layer 447a, the oxide semiconductor layers 442 and 472 can be sandwiched between silicon nitride films, and the entry of hydrogen or moisture can be effectively blocked. With such a structure, the concentration of water or hydrogen included in the oxide semiconductor layers 442 and 472 can be reduced to the utmost, and reentry of water or hydrogen can be prevented.

Embodiment 2

In Embodiment 1, the thin film transistor 470 including a wiring intersection and the thin film transistor 440 including the gate electrode layer 441 only above the oxide semiconductor layer 442 is described. Hereinafter, an example of forming an inverter circuit of an integrated circuit using two n-channel thin film transistors will be described. Note that since the manufacturing process of the thin film transistor is almost the same as that in Embodiment 1, only different points are described in detail.

An integrated circuit is formed using an inverter circuit, a capacitor, a resistor, and the like; therefore, a process of forming a capacitor and two kinds of resistors over one substrate in addition to the inverter circuit is also described.

When the inverter circuit is formed using two n-channel TFTs in combination, there are two kinds of inverter circuits: an inverter circuit having a combination of an enhancement type transistor and a depletion type transistor (referred to as an EDMOS circuit) and an inverter circuit having a combination of two enhancement type TFTs (hereinafter, referred to as an EEMOS circuit).

In this embodiment, an example of an EDMOS circuit is described. Further, an equivalent circuit of the EDMOS circuit is illustrated in FIG. 2. A cross-sectional structure of the inverter circuit is illustrated in FIG. 3.

Figure 3:
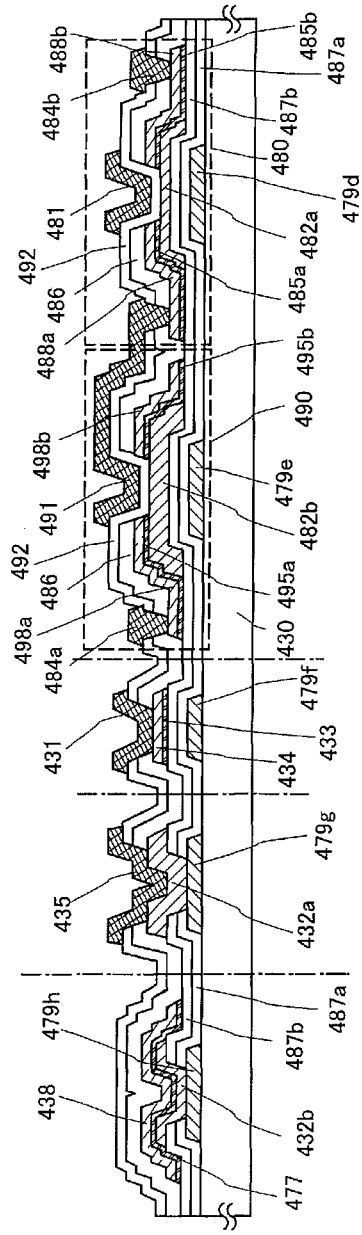
FIG. 3 is a cross-sectional view illustrating one embodiment of the present invention.

The circuit connection illustrated in FIG. 3 corresponds to that illustrated in FIG. 2. An example in which the first thin film transistor 480 is an enhancement type n-channel transistor and the second thin film transistor 490 is a depletion type n-channel transistor is illustrated.

In FIG. 3, electrode layers 479d, 479e, 479f, 479g, and 479h are provided over a substrate 430. The electrode layers 479d, 479e, 479f, 479g, and 479h can be formed by the same step and using the same material as the electrode layers 479a, 479b, and 479c in Embodiment 1.

A voltage is applied to the electrode layer 479d and the thin film transistor 480 functions as an enhancement type transistor whose threshold voltage is set positive. A voltage is also applied to the electrode layer 479e and the thin film transistor 490 functions as a depletion type transistor whose threshold voltage is set negative.

The electrode layer 479f is one electrode which forms the capacitor. The electrode layer 479g is one electrode connected to a first resistor. The electrode layer 479h is one electrode connected to a second resistor.

A first insulating layer 487a and a third insulating layer 487b are formed so as to cover the electrode layers 479d, 479e, 479f, 479g, and 479h. Note that although not illustrated, in a region where parasitic capacitance is to be reduced, a second insulating layer serving as a spacer insulating layer is provided as described in Embodiment 1. In the capacitor portion, the first insulating layer 487a overlapping with the electrode layer 479f and the third insulating layer 487b overlapping with the electrode layer 479f each become a dielectric.

In this embodiment, unlike in Embodiment 1, the second oxide semiconductor layer 482b has a thickness larger than that of the first oxide semiconductor layer 482a. Deposition and patterning are each performed twice to make the second oxide semiconductor layer 482b thick. With such a large thickness, the thin film transistor 490 can function as a depletion type transistor. Since a voltage by which the threshold voltage is set negative need not necessarily be applied to the electrode layer 479e, the electrode layer 479e can be omitted.

A third oxide semiconductor layer 432b formed to have the same thickness as that of the first oxide semiconductor layer 482a functions as a first resistor. An opening is formed in the first insulating layer 487a and the third insulating layer 487b which overlap with the electrode layer 479h, and the third oxide semiconductor layer 432b and the electrode layer 479h are electrically connected to each other through the opening. A fourth oxide semiconductor layer 432a formed to have the same thickness as that of the second oxide semiconductor layer 482b functions as a second resistor, whose resistance value is different from that of the first resistor. An opening is formed in the first insulating layer 487*a* and the third insulating layer 487*b* which overlap with the electrode layer 479*g*, and the fourth oxide semiconductor layer 432*a* and the electrode layer 479*g* are electrically connected to each other through the opening.

The thin film transistor 480 includes a first gate electrode layer 481 and the oxide semiconductor layer 482*a* overlapping with the first gate electrode layer 481 with a gate insulating layer 492 interposed therebetween. A first source electrode layer 485*b* which is in contact with part of the oxide semiconductor layer 482*a* electrically connects to a first wiring 484*b*. The first wiring 484*b* is a power supply line to which a negative voltage VDL is applied (a negative power supply line). This power supply line may be a power supply line with a ground potential (a ground potential power supply line).

The first source electrode layer 485*b* is formed using the same material as that of the first source electrode layer 445*a* in Embodiment 1, and the second source electrode layer 488*b* which is formed over and in contact with the first source electrode layer 485*b* is formed using the same material as that of the second source electrode layer 448*a* in Embodiment 1. In Embodiment 1, an example in which the insulating layer is formed and then patterned using the same mask as that of the insulating film is described; however, in this embodiment, the insulating film is formed in a step after the conductive layer is patterned. Subsequently, the insulating film is selectively removed to form an insulating layer 486, the conductive layer is selectively etched using the insulating layer 486 as a mask, and the first source electrode layer 485*b*, the second source electrode layer 488*b*, a first drain electrode layer 485*a*, and a second drain electrode layer 488*a* are formed. The insulating layer 486 is provided to reduce parasitic capacitance between a second gate electrode layer 491 and a fourth drain electrode layer 498*b* which are formed later.

In the capacitor portion, a first capacitor electrode layer 433 is formed in the same step and using the same material as the first source electrode layer 485*b*, and a second capacitor electrode layer 434 is formed in the same step and using the same material as the second source electrode layer 488*b*. The first capacitor electrode layer 433 and the second capacitor electrode layer 434 overlap with the electrode layer 479*f*.

A first electrode layer 477 is formed over and in contact with the third oxide semiconductor layer 432*b* which is the first resistor, in the same step and using the same material as the first source electrode layer 485*b*. A second electrode layer 438 is formed over the first electrode layer 477 in the same step and using the same material as the second source electrode layer 488*b*.

The second thin film transistor 490 includes the second gate electrode layer 491 functioning as a second wiring and the second oxide semiconductor layer 482*b* which overlaps with the second gate electrode layer 491 with the gate insulating layer 492 interposed therebetween. A third wiring 484*a* is a power supply line (a positive power supply line) to which a positive voltage VDH is applied.

The second thin film transistor 490 further includes a third source electrode layer 495*a* which is partly in contact with and overlapped with the second oxide semiconductor layer 482*b* and a fourth source electrode layer 498*a*. The second thin film transistor 490 includes a third drain electrode layer 495*b* which is partly in contact with and overlapped with the second oxide semiconductor layer 482*b* and the fourth drain electrode layer 498*b*. Note that the third source electrode layer 495*a* and the third drain electrode layer 495*b* are formed in the same step and using the same material as the first source electrode layer 485*b*. The fourth source electrode layer 498*a* and the fourth drain electrode layer 498*b* are formed in the same step and using the same material as the second source electrode layer 488*b*.

An opening is formed in the insulating layer 486 to reach the second drain electrode layer 488*a*. The second drain electrode layer 488*a* electrically connects to the second gate electrode layer 491 functioning as a second wiring, whereby the first thin film transistor 480 and the second thin film transistor 490 are connected to form an EDMOS circuit.

A fourth wiring 431 which connects to the second capacitor electrode layer 434 through an opening in the gate insulating layer 492 in a region overlapping with the electrode layer 479*f*, functions as a capacitor wiring.

A fifth wiring 435 is in contact with the fourth oxide semiconductor layer 432*a* which functions as the second resistor, through an opening in the gate insulating layer 492 in a region overlapping with the electrode layer 479*g*.

In this embodiment, an example in which an EDMOS circuit, a capacitor portion, a first resistor, and a second resistor are formed over one substrate is described; however, the thin film transistor in Embodiment 1 can also be formed over the same substrate, without particular limitation.

Figure 4A:
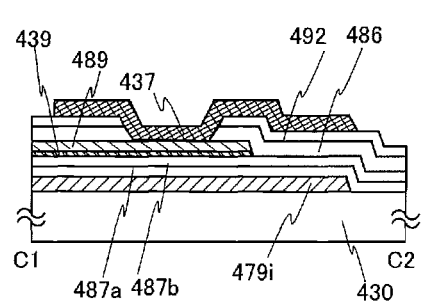
FIGS. 4A and 4B are respectively a cross-sectional view and a top view illustrating one embodiment of the present invention.
Figure 4B:
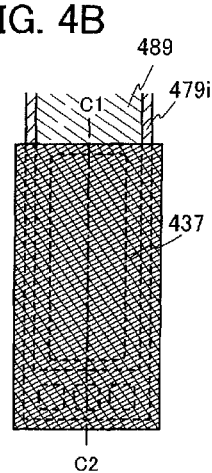

In this embodiment, a cross-sectional structure of a terminal portion of a wiring which can be formed over the same substrate is illustrated in FIGS. 4A and 4B. FIG. 4A is a cross-sectional view taken along line C1-C2 of FIG. 4B.

In FIG. 4A, a conductive layer 437 formed over a stack of the insulating layer 486 and the gate insulating layer 492 is a terminal electrode for connection which functions as an input terminal. In FIG. 4A, an electrode layer 479*i* which is formed of the same material as that of the electrode layers 479*d*, 479*e*, 479*f*, 479*g*, and 479*h* is provided below and overlaps with a first terminal electrode layer 439 which is electrically connected to the first source electrode layer 485*b*, with the first insulating layer 487*a* and the third insulating layer 487*b* interposed therebetween. The electrode layer 479*i* is not electrically connected to the first terminal electrode layer 439, and a capacitor as a countermeasure against noise or static electricity can be formed by setting the potential of the electrode layer 479*i* so as to be different from that of the first terminal electrode layer 439, for example, floating, GND, 0 V, or the like. The first terminal electrode layer 439, over which a second terminal electrode layer 489 is provided, is electrically connected to the conductive layer 437 with the insulating layer 486 and the gate insulating layer 492 interposed therebetween.

The first terminal electrode layer 439 can be formed using the same material and in the same step as the first source electrode layer 485*b*. The second terminal electrode layer 489 can be formed using the same material and in the same step as the second source electrode layer 488*b*. The conductive layer 437 can be formed using the same material and in the same step as the first gate electrode layer 481.

This embodiment can be freely combined with Embodiment 1.

Embodiment 3

In this embodiment, an example of manufacturing a CPU (central processing unit) using the EDMOS circuit described in Embodiment 2 will be described.

Figure 5:
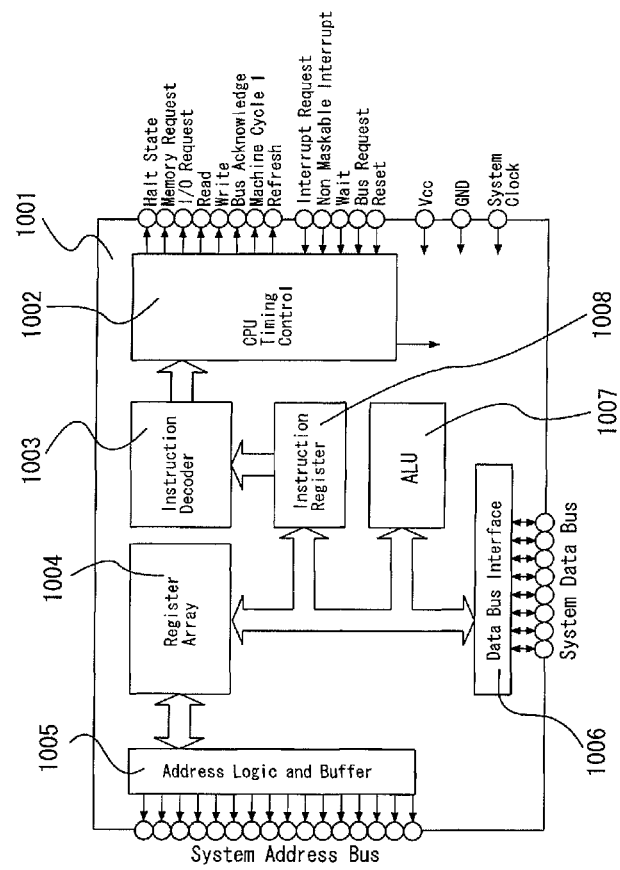
FIG. 5 is a block diagram illustrating one embodiment of the present invention.

An example of a block diagram of a CPU is illustrated in FIG. 5. A CPU 1001 illustrated in FIG. 5 includes a timing control circuit 1002, an instruction decoder 1003, a register array 1004, an address logic and buffer circuit 1005, a data bus interface 1006, an ALU 1007, an instruction register 1008, and the like.

These circuits are manufactured using the thin film transistor, the inverter circuit, the resistor, the capacitor, and the like described in Embodiment 1 or Embodiment 2. The thin film transistors described in Embodiment 1 or Embodiment 2 each use an oxide semiconductor layer with sufficiently reduced hydrogen concentration, whereby the off-current of the thin film transistor can be extremely small. By using a thin film transistor including an oxide semiconductor layer with sufficiently reduced hydrogen concentration for at least part of the CPU 1001, power consumption can be reduced.

Now, each circuit will be briefly described. The timing control circuit 1002 receives an instruction from the external, converts the instruction into information for the internal, and sends the information to other blocks. In addition, the timing control circuit gives directions such as reading and writing of memory data to the external, according to internal operation. The instruction decoder 1003 serves to convert instruction from the external into information for the internal. The register array 1004 is a volatile memory for temporarily storing data. The address logic and buffer circuit 1005 is a circuit for specifying the address of an external memory. The data bus interface 1006 is a circuit for taking data in and out of an external memory or a device such as a printer. The ALU 1007 is a circuit for performing an operation. The instruction register 1008 is a circuit for temporarily storing an instruction. The CPU includes combination of such circuits.

By using any of the thin film transistors described in Embodiments 1 and 2 for at least part of the CPU 1001, leakage current in a standby period is reduced; thus, power consumption of the driver circuit or the like used in electronic devices can be reduced.

This embodiment can be freely combined with any of Embodiments 1 and 2.

Embodiment 4

In this embodiment, an example of a usage mode of the semiconductor device described in the above embodiments will be described. Specifically, an application example of a semiconductor device that can input and output data without contact is described below with reference to drawings. The semiconductor device capable of wirelessly transmitting and receiving data is also called an RFID tag, an ID tag, an IC tag, an RF tag, a wireless tag, an electronic tag, or a wireless chip depending on the application.

One example of a top structure of a semiconductor device described in this embodiment is described with reference to FIG. 8A. The semiconductor device illustrated in FIG. 8A includes a semiconductor integrated circuit chip 400 having an antenna (also referred to as an on-chip antenna) and a supporting substrate 406 having an antenna 405 (also referred to as a booster antenna). The semiconductor integrated circuit chip 400 is provided over an insulating layer 410 (FIG. 8C) that is formed over the supporting substrate 406 and the antenna 405. The semiconductor integrated circuit chip 400 can be fixed to the supporting substrate 406 and the antenna 405 by using the insulating layer 410.

Note that a conductive shield is provided on a surface of the semiconductor integrated circuit chip 400 to prevent electrostatic breakdown of the semiconductor integrated circuit (e.g., malfunction of the circuit and damage to a semiconductor element) due to electrostatic discharge. When the conductive shield has high resistance and current cannot pass through the pattern of the antenna 405, the antenna 405 and the conductive shield provided on the surface of the semiconductor integrated circuit chip 400 may be provided in contact with each other.

As for a semiconductor integrated circuit provided in the semiconductor integrated circuit chip 400, elements such as a plurality of thin film transistors for constituting a memory portion or a logic portion are provided. As a thin film transistor for constituting a memory portion or a logic portion, a thin film transistor using a highly purified oxide semiconductor layer with sufficiently reduced hydrogen concentration is used. As a semiconductor element in a semiconductor device according to this embodiment, not only a field-effect transistor but also a memory element which uses a semiconductor layer can be employed; accordingly, a semiconductor device which can meet functions required for various applications can be manufactured and provided.

Figure 7A:
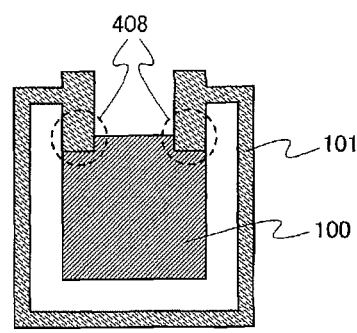
FIGS. 7A and 7B are views each illustrating a semiconductor device.
Figure 8A:
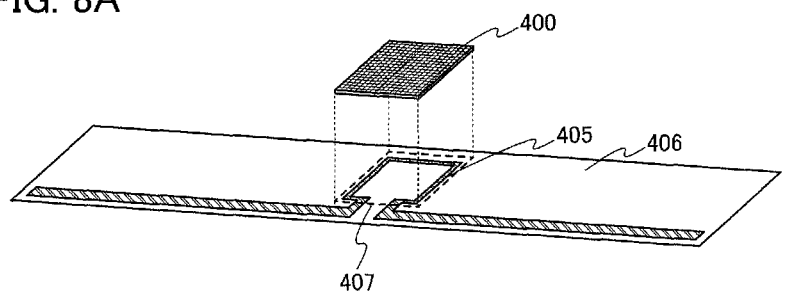
FIGS. 8A to 8C are views illustrating a semiconductor device.

FIG. 7A is an enlarged view of the antenna and the semiconductor integrated circuit that are included in the semiconductor integrated circuit chip 400 illustrated in FIG. 8A. In FIG. 7A, the antenna 101 is a rectangular loop antenna in which the number of windings is 1; however, an embodiment of the present invention is not limited to this structure. The shape of the loop antenna is not limited to a rectangle and may be a shape with curve, for example, a circle. In addition, the number of windings is not limited to 1 and may be plural. However, when the number of windings of the antenna 101 is 1, parasitic capacitance generated between the semiconductor integrated circuit 100 and the antenna 101 can be reduced.

Figure 7B:
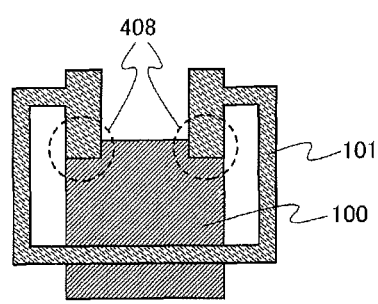

In FIG. 8A and FIG. 7A, the antenna 101 is arranged so as to surround the periphery of the semiconductor integrated circuit 100, and the antenna 101 is arranged in a region different from a region of the semiconductor integrated circuit 100, except portions corresponding to power feeding points 408 indicated by a dashed line. However, this embodiment is not limited to this structure. As illustrated in FIG. 7B, the antenna 101 may be arranged so as to at least partly overlap with the semiconductor integrated circuit 100 in addition to the portions corresponding to the power feeding points 408 indicated by the dashed line. Note that in the case where the antenna 101 is arranged in a region different from a region of the semiconductor circuit 100 as illustrated in FIG. 8A and FIG. 7A, parasitic capacitance generated between the semiconductor integrated circuit 100 and the antenna 101 can be reduced.

In FIG. 8A, the antenna 405 can transmit and receive signals or supply power to/from the antenna 101 by electromagnetic induction mainly in a loop-like shaped portion surrounded by a dashed line 407. In addition, the antenna 405 can send and receive a signal to/from an interrogator or supply power by using a radio wave mainly in a region other than a portion surrounded by the dashed line 407. A radio wave used as a carrier (a carrier wave) between the interrogator and the semiconductor device preferably has a frequency of about 30 MHz to 5 GHz, and for example, may have a frequency band of 950 MHz or 2.45 GHz.

The antenna 405 is a rectangular loop antenna in which the number of windings is 1 in the portion surrounded by the dashed line 407; however, an embodiment of the present invention is not limited to this structure. The shape of the loop antenna is not limited to a rectangle and may be a shape with curve, for example, a circle. In addition, the number of windings is not limited to 1 and may be plural.

For the semiconductor device described in this embodiment, an electromagnetic induction method, an electromagnetic coupling method, or a microwave method can be employed. In the case of a microwave method, the shapes of the antenna 101 and the antenna 405 may be determined as appropriate depending on the wavelength of an electromagnetic wave.

If a microwave method (e.g., UHF band (860 MHz band to 960 MHz band), or 2.45 GHz band) is used as the signal transmission method in the semiconductor device, the length, shape, or the like of the antenna may be determined as appropriate in consideration of the wavelength of an electromagnetic wave used for signal transmission. For example, each of the antennas can be formed into a linear shape (e.g., a dipole antenna) or a flat shape (e.g., a patch antenna or an antenna having a ribbon shape). Further, each of the antennas is not limited to a linear shape and may have a curved shape, a serpentine curved shape, or in a shape combining them in consideration of the wavelength of the electromagnetic wave.

Figure 9:
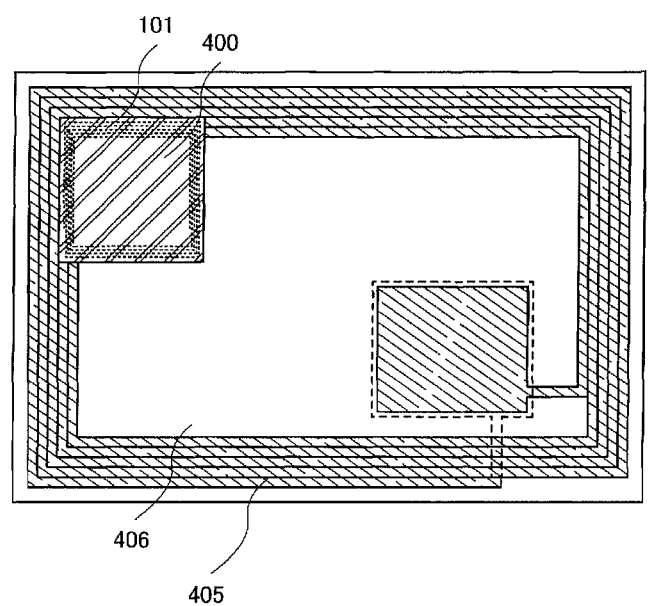
FIG. 9 is a view illustrating a semiconductor device.

An example in which the antenna 101 and the antenna 405 have coil shapes and an electromagnetic induction method or an electromagnetic coupling method is used is illustrated in FIG. 9.

In FIG. 9, the semiconductor integrated circuit chip 400 having the coiled antenna 101 is formed over the supporting substrate 406 provided with the coiled antenna 405 as a booster antenna. Note that the supporting substrate 406 is sandwiched between the antenna 405 which is a booster antenna, and a capacitor is formed.

Figure 8B:
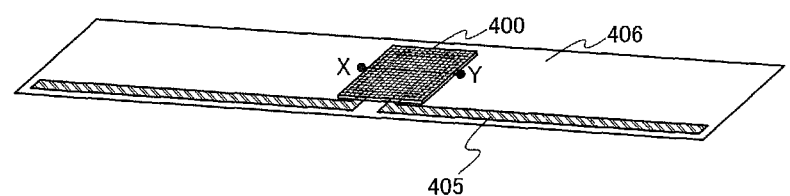

Next, the structures and arrangements of the semiconductor integrated circuit chip 400 and the booster antenna will be described. FIG. 8B is a perspective view of the semiconductor device illustrated in FIG. 8A, in which the semiconductor integrated circuit chip 400 and the antenna 405 formed over the supporting substrate 406 are stacked. In addition, FIG. 8C is a cross-sectional view along a dashed line X-Y of FIG. 8B.

Figure 8C:
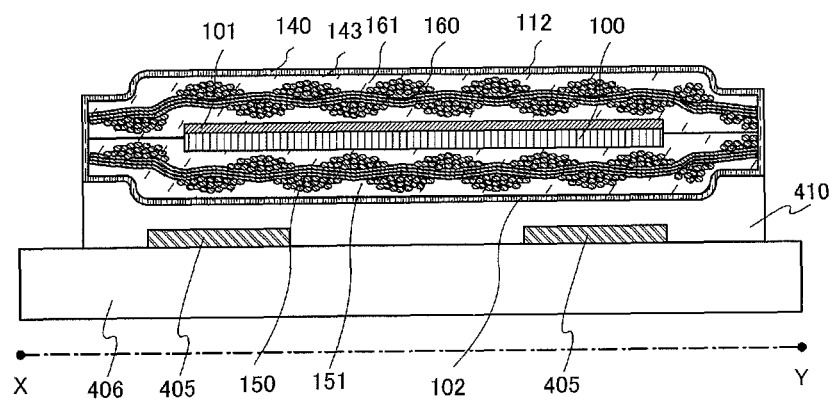

As the semiconductor integrated circuit chip 400 illustrated in FIG. 8C, any of the semiconductor devices described in Embodiment 1 or Embodiment 2 can be used, and here, a chip obtained by cutting the semiconductor integrated circuit into individual chips is referred to as a semiconductor integrated circuit chip. Note that, although the semiconductor integrated circuit chip illustrated in FIG. 8C is an example of using Embodiment 1, this embodiment is not limited to this structure and can be applied to another embodiment.

The semiconductor integrated circuit 100 illustrated in FIG. 8C is sandwiched between a first insulator 112 and a second insulator 102, and the side surface is also sealed. In this embodiment, the first insulator and the second insulator between which a plurality of semiconductor integrated circuits is sandwiched are attached, and then the semiconductor integrated circuits are individually divided into stacks. A conductive shield is formed each for the divided stacks, and the semiconductor integrated circuit chips 400 are formed. There is no particular limitation on a separation means as long as physical separation is possible, and separation is performed by laser beam irradiation in this embodiment.

In FIG. 8C, the semiconductor integrated circuit 100 is closer to the antenna 405 than the antenna 101; however an embodiment of the present invention is not limited to this structure. The antenna 101 may be closer to the antenna 405 than the semiconductor integrated circuit 100. The semiconductor integrated circuit 100 and the antenna 101 may be directly attached to the first insulator 112 and the second insulator 102, or may be attached by a bonding layer functioning as an adhesive.

Figure 6:
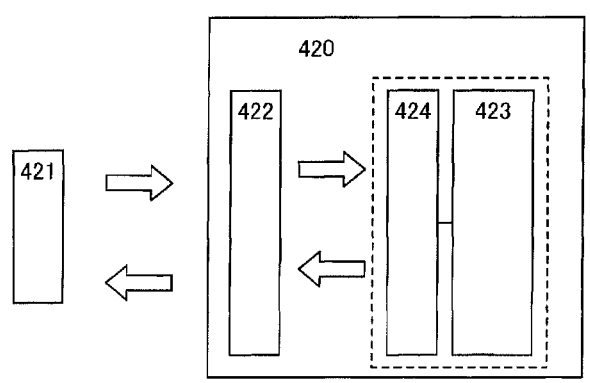
FIG. 6 illustrates a block diagram.

Next, operation of the semiconductor device of this embodiment will be described. FIG. 6 is a block diagram illustrating an example of a structure of a semiconductor device of this embodiment. A semiconductor device 420 illustrated in FIG. 6 includes an antenna 422 as a booster antenna, a semiconductor integrated circuit 423, and an antenna 424 as an on-chip antenna. When an electromagnetic wave is transmitted from an interrogator 421, the antenna 422 receives the electromagnetic wave to generate alternate current, whereby a magnetic field is generated around the antenna 422. Then, a loop portion of the antenna 422 is electromagnetically coupled to the loop antenna 424, so that induced electromotive force is generated in the antenna 424. The semiconductor integrated circuit 423 receives a signal or power from the interrogator 421 by using the induced electromotive force. On the other hand, current flows into the antenna 424 and induced electromotive force is generated in the antenna 422 in accordance with a signal generated in the semiconductor integrated circuit 423, whereby a signal can be sent to the interrogator 421 using a reflected wave of the radio wave that is sent from the interrogator 421.

Note that the antenna 422 can be divided between the loop portion that is mainly electromagnetically coupled to the antenna 424 and a portion that mainly receives electromagnetic waves from the interrogator 421. The shape of the antenna 422 in the portion in which an electric wave from the interrogator 421 is mainly received may be a shape in which an electric wave can be received. For example, the shape of a dipole antenna, a folded dipole antenna, a slot antenna, a meander line antenna, a microstrip antenna, or the like may be used.

Although FIGS. 8A to 8C illustrate the structure of the semiconductor integrated circuit having only one antenna, this embodiment of the disclosed invention is not limited to this structure. A semiconductor device may include two antennas, that is, an antenna for receiving power and an antenna for receiving a signal. With the two antennas, frequency of a radio wave for supplying power and frequency of a radio wave for transmitting a signal can be separately used.

In a semiconductor device of this embodiment, the on-chip antenna is used and a signal or power can be sent and received between the booster antenna and the on-chip antenna without contact; therefore, unlike the case where a semiconductor integrated circuit is connected to an external antenna, the semiconductor integrated circuit and the antenna are less likely to be disconnected due to external force, and generation of initial failure in the connection can also be suppressed. In addition, the booster antenna is used in this embodiment. Accordingly, unlike the case where only the on-chip antenna is used, the advantage of an external antenna can also be offered: that is, the area of the semiconductor integrated circuit does not significantly limit the size or shape of the on-chip antenna, the frequency band of radio waves capable of being received is not restricted, and the communication distance can be increased.

The semiconductor integrated circuit can be directly formed over a flexible substrate. Alternatively, the semiconductor integrated circuit may be transferred from a formation substrate (for example, a glass substrate) to another substrate (for example, a plastic substrate).

There is no particular limitation on the method of transferring the semiconductor integrated circuit from the formation substrate to another substrate, and a variety of methods can be used. For example, a separation layer may be formed between the formation substrate and the semiconductor integrated circuit.

For example, in the case where a metal oxide film is formed as the separation layer, the metal oxide film is weakened by crystallization, and an element layer including the semiconductor integrated circuit, which is a layer to be separated, can be separated from the formation substrate. After the metal oxide film is weakened by crystallization, part of the separation layer may be removed by etching with use of a halogen fluoride gas such as $NF_3$, $BrF_3$, or $ClF_3$, and then separation may be performed in the weakened metal oxide film.

In addition, when a substrate having a light-transmitting property is used as the formation substrate and a film containing nitrogen, oxygen, hydrogen or the like (e.g., an amorphous silicon film containing hydrogen, an alloy film containing hydrogen, an alloy film containing oxygen or the like) is used as the separation layer, the separation layer is irradiated with laser light through the formation substrate, and nitrogen, oxygen, or hydrogen contained in the separation layer is evaporated so that separation can occur between the formation substrate and the separation layer.

Alternatively, the layer to be separated may be separated from the formation substrate by removing the separation layer by etching.

Alternatively, a method of removing the formation substrate by mechanical grinding or a method of removing the formation substrate by etching using a halogen fluoride gas such as $NF_3$, $BrF_3$, $ClF_3$ or the like or HF, or the like can be employed. In this case, the separation layer can be omitted.

Alternatively, laser irradiation, etching using a gas, a solution, or the like, or a sharp knife or a scalpel, can be used so as to form a groove to expose the separation layer. The groove can trigger separation of the layer to be separated from the formation substrate from the separation layer.

For example, as a separation method, mechanical force (a separation process with a human hand or with a gripper, a separation process by rotation of a roller, or the like) may be used. Alternatively, the layer to be separated may be separated from the separation layer in such a manner that a liquid is dropped into the groove to allow the liquid to be infiltrated into the interface between the separation layer and the layer to be separated. Alternatively, a method can be employed in which a fluoride gas such as $NF_3$, $BrF_3$, or $ClF_3$ is introduced into the groove, and the separation layer is removed by etching with the use of the fluoride gas so that the layer to be separated is separated from the formation substrate. The separation may be performed while pouring a liquid such as water.

As another separation method, if the separation layer is formed using tungsten, separation can be conducted while the separation layer is being etched by a mixed solution of ammonia water and hydrogen peroxide water.

A thin film transistor using a highly purified oxide semiconductor layer with sufficiently reduced hydrogen concentration has a small off-current, and can realize low power consumption. By the conductive shield covering the semiconductor integrated circuit, electrostatic breakdown of the semiconductor integrated circuit (malfunction of the circuit or damage of the semiconductor element) due to electrostatic discharge can be prevented. Furthermore, by using the pair of insulators holding the semiconductor integrated circuit therebetween, a resistant and highly-reliable semiconductor device having a reduced thickness and size can be provided.

Embodiment 5

This embodiment will describe examples of the application of a semiconductor device capable of wireless data communication, which includes the above-described nonvolatile semiconductor memory device formed using the device in Embodiment. 4. According to its mode of use, a semiconductor device capable of inputting and outputting data contactlessly may also be referred to as an RFID tag, an ID tag, an IC tag, an IC chip, an RF tag, a wireless tag, an electronic tag, or a wireless chip.

Figure 10A:
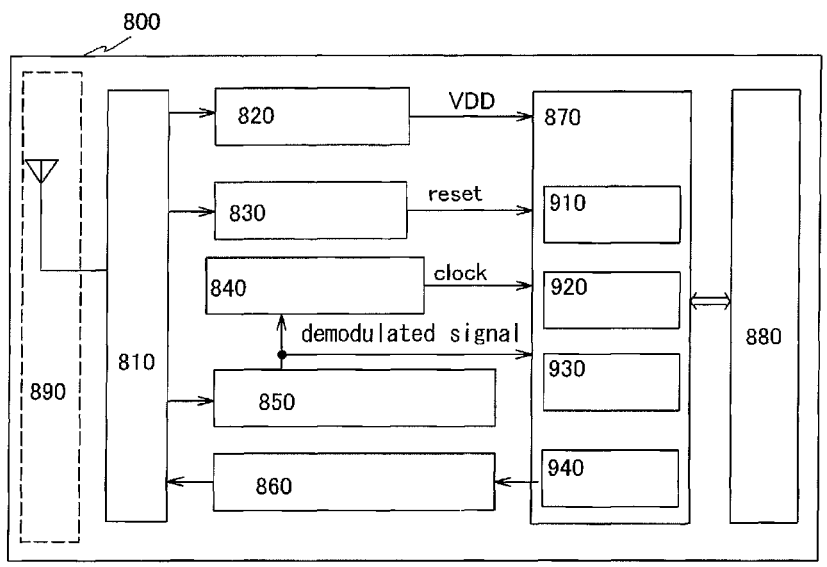
FIGS. 10A to 10C are views illustrating a semiconductor device.

A semiconductor device 800 has a function of communicating data without contact, and includes a high-frequency circuit 810, a power supply circuit 820, a reset circuit 830, a clock generating circuit 840, a data demodulating circuit 850, a data modulating circuit 860, a control circuit 870 which controls another circuit, a memory circuit 880, and an antenna 890 (see FIG. 10A). The high-frequency circuit 810 receives a signal from the antenna 890 and outputs a signal received from the data demodulating circuit 860 through the antenna 890. The power supply circuit 820 generates a power supply potential from the received signal. The reset circuit 830 generates a reset signal. The clock generating circuit 840 generates various clock signals based on the signal input from the antenna 890. The data demodulating circuit 850 demodulates the received signal and outputs the signal to the control circuit 870. The data modulating circuit 860 modulates a signal received from the control circuit 870. Further, as the control circuit 870, a code extracting circuit 910, a code determining circuit 920, a CRC determining circuit 930, and an output unit circuit 940 are provided, for example. The control circuit 870 includes, for example, a code extracting circuit 910, a code determining circuit 920, a CRC determining circuit 930, and an output unit circuit 940. The code determining circuit 920 compares the extracted code with a reference code to determine the content of the instruction. The CRC determining circuit 930 detects a transmission error and the like based on the determined code.

Next, an example of an operation of the above-mentioned semiconductor device will be described. First, a radio signal is received by the antenna 890. The radio signal is transmitted to the power supply circuit 820 via the high frequency circuit 810, thereby generating a high power supply potential (hereinafter referred to as a VDD). The VDD is supplied to each circuit of the semiconductor device 800. A signal transmitted to the data demodulating circuit 850 via the high frequency circuit 810 is demodulated (hereinafter referred to as a demodulated signal). Further, a signal and a demodulated signal passing through the reset circuit 830 and the clock generating circuit 840 via the high frequency circuit 810 are transmitted to the control circuit 870. The signals transmitted to the control circuit 870 are analyzed by the code extracting circuit 910, the code determining circuit 920, the CRC determining circuit 930, and the like. Then, based on the analyzed signals, information in the semiconductor device stored in the memory circuit 880 is output. The output data of the semiconductor device 800 is encoded via the output unit circuit 940. In addition, the encoded data of the semiconductor device 800 passes through the data modulating circuit 860 to be transmitted as a radio signal via the antenna 890. Note that a low power supply potential (hereinafter referred to as VSS) is common in the plurality of circuits included in the semiconductor device 800, and GND can be used as VSS.

In this manner, the data of the semiconductor device 800 can be read by transmitting a signal from a communication device to the semiconductor device 800 and receiving a signal from the semiconductor device 800 by the communication device.

Moreover, in the semiconductor device 800, power supply voltage may be supplied to each circuit by electromagnetic waves without mounting a power source (battery), or a power source (battery) may be mounted so that power supply voltage is supplied to each circuit by both electromagnetic waves and the power source (battery).

Figure 10B:
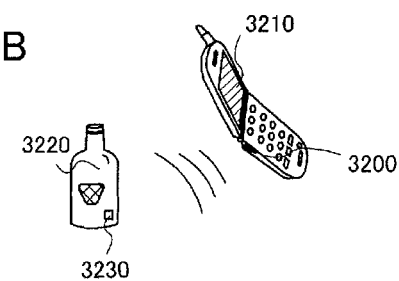
Figure 10C:
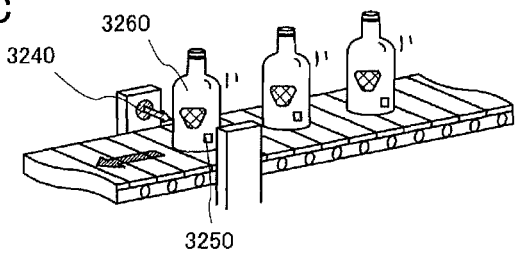

Next, an example of a mode of use of a semiconductor device capable of inputting and outputting data contactlessly will be described. A communication device 3200 is provided for a side surface of a mobile terminal which includes a display portion 3210. A semiconductor device 3230 is provided for a side surface of an article 3220 (FIG. 10B). When the communication device 3200 is put close to the semiconductor device 3230 on the article 3220, information on the article 3220, such as the raw material or the source of the product, inspection result in each production step, history of the distribution process, and explanation of the article is displayed on the display portion 3210. When a product 3260 is transferred by a conveyer belt, the product 3260 can be inspected using a communication device 3240 and a semiconductor device 3250 provided on the product 3260 (FIG. 10C). When the semiconductor device is used in a system in this manner, information can be obtained easily, and higher performance and higher added value are achieved.

As described above, a semiconductor device of the present invention, which has a very wide range of application, can be used in electronic devices in all kinds of fields.

Embodiment 6

The thin film transistors obtained in Embodiment 1 or Embodiment 2 are thin film transistors each using a highly purified oxide semiconductor. By forming a circuit using the thin film transistors, low power consumption can be realized and operation of a memory circuit can be stabilized.

In this embodiment, an example of a memory circuit which can be formed using the thin film transistor in Embodiment 1 is described.

Figure 11A:
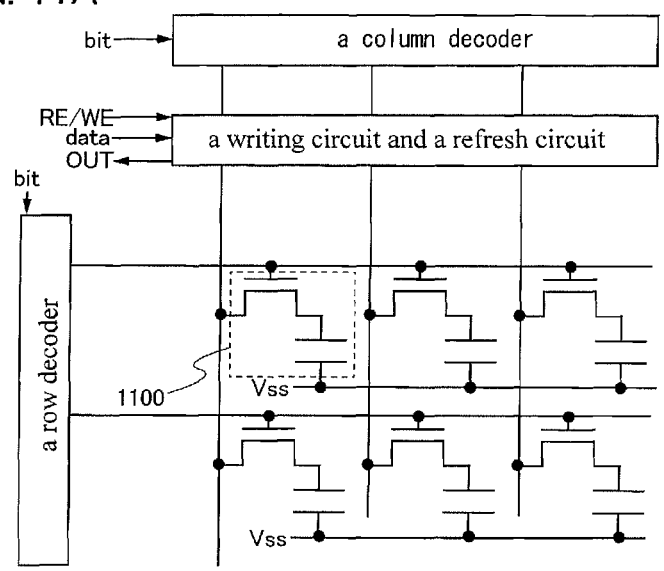
FIGS. 11A and 11B are equivalent circuit diagrams illustrating one embodiment of the present invention.

FIG. 11A illustrates an equivalent circuit diagram of an example of a memory circuit. The memory circuit illustrated in FIG. 11A includes a row decoder, a writing circuit and a refresh circuit, a column decoder, and memory elements 1100 arranged in matrix. A signal line connected to the memory elements 1100 arranged in matrix is connected to the row decoder through the writing circuit and the refresh circuit, and a scan line connected to the memory elements 1100 arranged in matrix is connected to the column decoder. A bit signal is input to the row decoder. A read enable signal and a write enable signal (RE/WE), a data signal (data), and an output signal (OUT) are input to the writing circuit and the refresh circuit.

Each of the memory elements 1100 includes a capacitor element and a thin film transistor. One of a source and a drain of the thin film transistor is connected to the signal line, and the other of the source and the drain of the thin film transistor is connected to one electrode of the capacitor element, and the other electrode of the capacitor element is connected to the low potential side (preferably, a reference potential Vss).

Figure 11B:
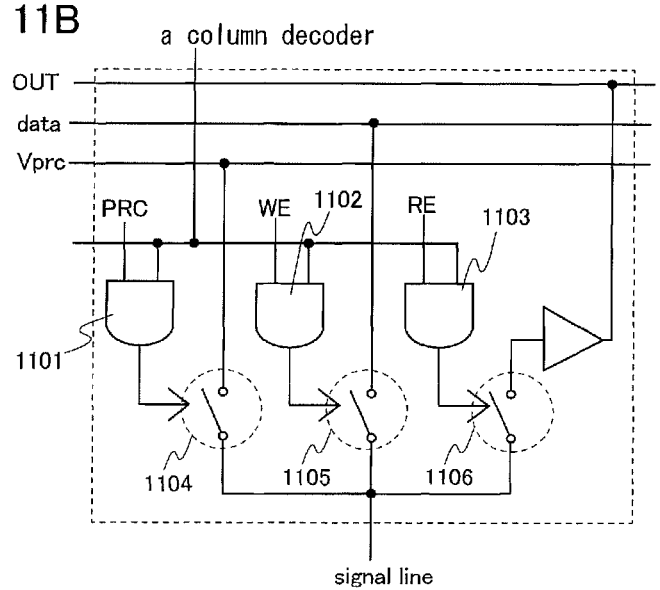

FIG. 11B illustrates a specific structural example of the refresh circuit provided in the writing circuit and the refresh circuit illustrated in FIG. 11A.

The writing circuit and the refresh circuit illustrated in FIG. 11B include an AND circuit and a sense amplifier. To one input of each of a first AND circuit 1101, a second AND circuit 1102, and a third AND circuit 1103, a signal is input from the row decoder. A PRC signal is input to the other input of the first AND circuit 1101, the write enable signal (WE) is input to the other input of the second AND circuit 1102, and the read enable signal (RE) is input to the other input of the third AND circuit 1103. The output of the first AND circuit 1101 controls on/off of a first switch 1104, the output of the second AND circuit 1102 controls on/off of a second switch 1105, and the output of the third AND circuit 1103 controls on/off of a third switch 1106. A pre-charge signal line Vprc is connected to the signal line through the first switch 1104, and a data signal line data is connected to the signal line through the second switch 1105.

The signal line connected though the first switch 1104 and the second switch 1105 are connected to the sense amplifier through the third switch 1106. A signal is output to the output signal line (OUT) from the sense amplifier.

Note that the above AND circuit may have a general structure, and preferably has a simple structure.

A sense amplifier is a circuit having a function of amplifying input signals.

Note that as a signal here, an analog signal or a digital signal which uses voltage, current, resistance, frequency, or the like can be used, for example. For example, at least two potentials, that is, a first potential and a second potential are set, a high-level (also referred to as high potential or $V_H$) potential is used as the first potential, and a low-level (also referred to as low potential or $V_L$) potential is used as the second potential, whereby a binary digital signal can be set. Although $V_H$ and $V_L$ are preferably constant values, $V_H$ and $V_L$ may take a wide range of values, in consideration of influence of noise.

Note that here, terms with ordinal numbers, such as "first" and "second", are used in order to avoid confusion among components, and the terms do not limit the components numerically.

Thus, a memory circuit can be manufactured using the thin film transistor described in Embodiment 1 and the capacitor described in Embodiment 2.

A refresh timing of the memory circuit is determined to a certain time interval in the design phase, based on the leakage current of the memory elements 1100 which is evaluated in advance. That is, the refresh timing is set in consideration of the temperature dependence of leakage current and fluctuation of the manufacturing process, after the chip is completed.

In the thin film transistors described in Embodiment 1 or Embodiment 2, an oxide semiconductor layer with sufficiently reduced hydrogen concentration is used, whereby the off-current of the thin film transistors can be made extremely small. Further, since temperature characteristics of the off-current hardly change within the temperature of from −30° C. to 120° C., the extremely small value can be kept.

Therefore, when the thin film transistors described in Embodiment 1 or Embodiment 2 are used, refresh interval can be set long compared to a transistor using silicon, and power consumption in a standby period can be reduced.

In addition, since the off-current has little temperature dependence, the memory circuit in this embodiment is suitable for an in-vehicle electronic device. Since leakage current in a standby period is extremely small, when used for electric vehicles, traveling distance per a certain amount of charging hardly changes even when the standby period is long.

The thin film transistors described in Embodiment 1 or Embodiment 2 each use an oxide semiconductor which is intrinsic or substantially intrinsic, in which impurities which may become carrier donors (donors or acceptors) are reduced to an extremely small number.

Figure 12:
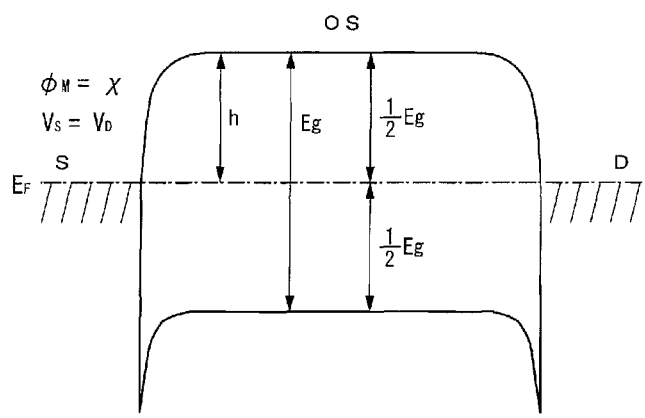
FIG. 12 is a diagram illustrating a band structure between a source and a drain of a MOS transistor using an oxide semiconductor.

FIG. 12 illustrates a band structure between the source and the drain of the thin film transistor described in Embodiment 1 or Embodiment 2. Fermi level of the highly purified oxide semiconductor is positioned in the center of the forbidden band in an ideal state. In an oxide semiconductor with sufficiently reduced hydrogen concentration, the number of minority carriers (holes in this case) is zero or extremely close to zero.

When work function is φm and electron affinity of the oxide semiconductor is χ, in the case where work function φm is smaller than the electron affinity χ, ohmic contact is formed with electrons.

Here, when φm=χ, Fermi level of an electrode metal and the level of the end of the conduction band of the oxide semiconductor correspond to each other at the bonding surface. When it is assumed that the band gap is 3.05 eV, the electronic affinity is 4.3 eV, the state is an intrinsic state (the carrier concentration is approximately $1\times10^{-7}/cm^3$), and titanium (Ti) whose work function is 4.3 eV is used as the source electrode and the drain electrode, barrier is not formed against electrons, as illustrated in FIG. 12.

Figure 13:
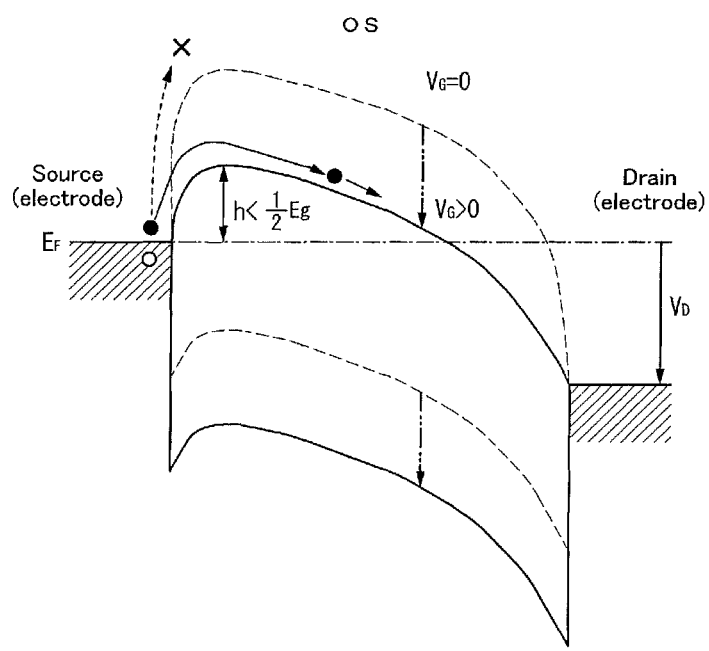
FIG. 13 is a diagram illustrating a state in which a positive voltage is applied to the drain side in FIG. 12.

A schematic view of the energy band structure is illustrated in FIG. 13. In a state where positive voltage ($V_D>0$) is applied to the drain, the dashed line illustrates a case where a voltage is not applied to a gate ($V_G=0$), and the solid line illustrates a case where positive voltage ($V_G>0$) is applied to the gate. In the case where a voltage is not applied to the gate, carriers (electrons) are not injected from the electrode to the oxide semiconductor side because of high potential barrier, and an off state where no current flows is shown. On the other hand, when positive voltage is applied to the gate, potential barrier is reduced, and an on state where current flows is shown.

Here, height of the barrier has influence on carrier mobility. When the drain voltage is increased, the height of the barrier ($h_b$) becomes smaller and mobility increases. If the work function φm of the source electrode is approximately the same as the electron affinity of the oxide semiconductor, $h_b$ becomes further smaller, and higher mobility can be expected. Note that it is necessary that such an electrode material and the oxide semiconductor do not come into contact with each other to form an insulator.

In such a case, in a bottom-gate (inverted stagger) transistor, the barrier between the source and the drain becomes small, and a parasitic channel is more likely to be formed. Therefore, a top-gate transistor is preferably used in the case of increasing mobility.

Figure 14A:
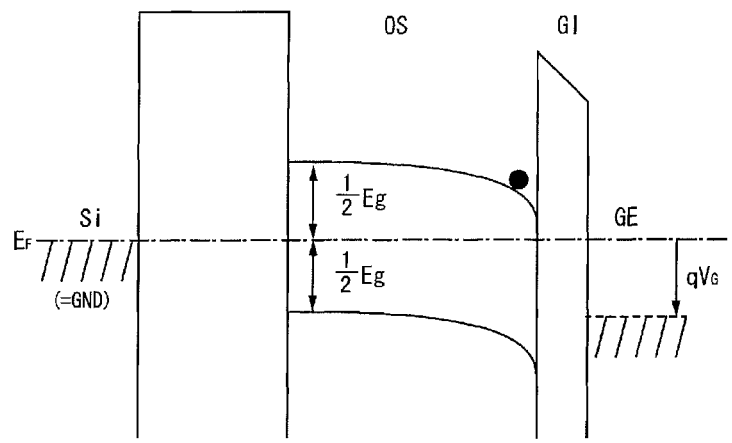
FIGS. 14A and 14B are energy band diagrams of a MOS structure of the MOS transistor using an oxide semiconductor, illustrating a case where a gate voltage is set positive and a case where the gate voltage is set negative, respectively.

FIG. 14A is an energy band diagram of a MOS structure when the gate voltage is set positive, which illustrates the case of a transistor using an oxide semiconductor. In this case, thermally excited carriers hardly exist in a highly purified oxide semiconductor, and carriers are not accumulated in the vicinity of the gate insulating film even when positive gate voltage is applied. However, carriers injected from the source side can be propagated as illustrated in FIG. 13.

Figure 14B:
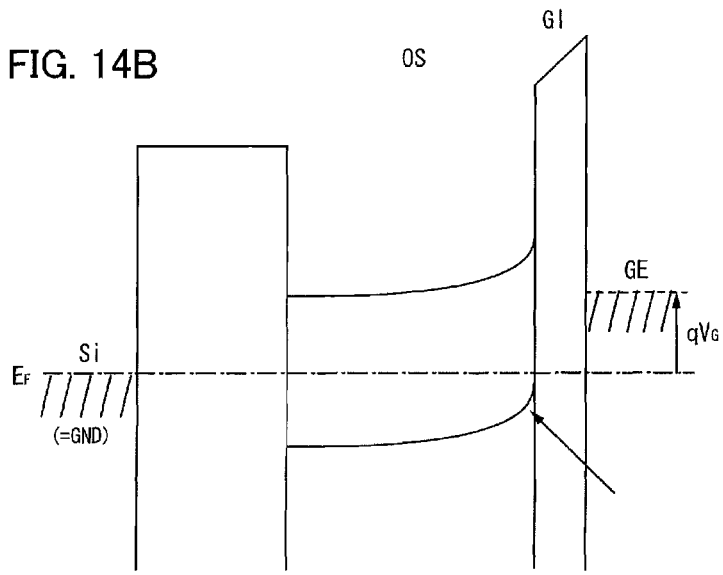

FIG. 14B is an energy band diagram of a MOS structure when the gate voltage is set negative, which illustrates the case of a transistor using an oxide semiconductor. Since the oxide semiconductor has almost no minority carriers (holes), carriers are not accumulated in the vicinity of the gate insulating film. This means that the off-current is small.

Figure 15:
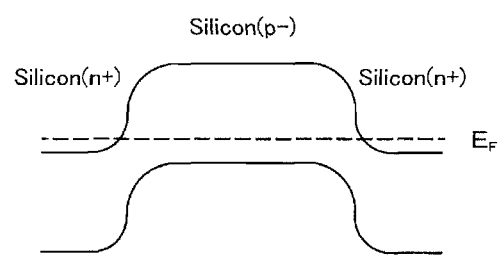
FIG. 15 is a comparative diagram illustrating a band structure between a source and a drain of a silicon MOS transistor.

Note that a band diagram of a transistor in the case of using a silicon semiconductor is illustrated in FIG. 15. The intrinsic carrier density of the silicon semiconductor is approximately $1.45\times10^{10}/cm^3$ (300 K), and carriers exist even at room temperature. In practical use, a silicon wafer to which an impurity element such as phosphorus or boron is added is used; therefore, the silicon semiconductor actually has $1\times10^{14}/cm^3$ or more carriers which contribute to conduction between the source and the drain. Further, since the band gap of the silicon semiconductor is 1.12 eV, the off-current of a transistor using a silicon semiconductor greatly fluctuates depending on temperature.

As described above, carriers which are thermally excited at a practical operation temperature can be eliminated so that a transistor can operate only by the carriers injected from the source side; not by simply using an oxide semiconductor with a wide band gap for the transistor, but by reducing impurities such as hydrogen which form donors as much as possible so that the carrier concentration is lower than or equal to $1\times10^{14}/cm^3$, preferably lower than or equal to $1\times10^{12}/cm^3$. Accordingly, the off-current is decreased to be less than $1\times10^{-13}$ A and a transistor with extremely stable operation, whose off-current hardly changes depending on temperature, can be obtained.

Embodiment 7

In this embodiment, an example of a shift register which can be formed using the thin film transistors in Embodiment 1 or Embodiment 2 is described.

Figure 16A:
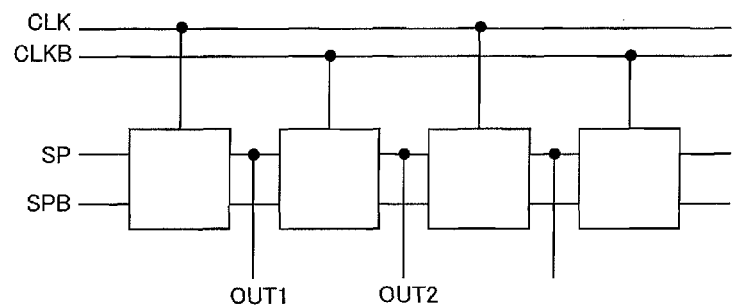
FIGS. 16A and 16B are equivalent circuit diagrams illustrating one embodiment of the present invention.

FIG. 16A is an equivalent circuit diagram illustrating an example of a shift register. The shift register illustrated in FIG. 16A includes two clock signal lines and two stages of flip-flops each of which is electrically connected to either of these clock signal lines. Note that a clock signal line may be further provided, and a larger number of stages of flip-flops may be provided.

In the two clock signal lines, each clock signal is input as follows: when one clock signal line is switched to high level ($V_H$), the other is switched to low level ($V_L$).

In the shift register illustrated in FIG. 16A, an example of a shift register is illustrated, which includes flip-flops which are in order from a flip-flop in a first stage which is electrically connected to a first clock signal line CLK and a flip-flop in a second stage which is electrically connected to the second clock signal line CLKB, to a flip-flop in an (n−1)th stage and a flip-flop in an (n) th stage. However, the present invention is not limited thereto, and the shift register having at least a first flip-flop and a second flip-flop is acceptable.

The clock signal line CLK is a wiring to which a clock signal CK is input.

A clock signal line CLKB is a wiring to which a clock signal CKB is input.

The clock signal CK and the clock signal CKB can be generated using a NOT circuit (inverter circuit) for example.

A start signal SP and a start signal SPB are input to the first flip-flop, a clock signal CK is input thereto as a clock signal, and the first flip-flop outputs an output signal OUT depending on the state of the signal SP, the signal SPB, and the clock signal CK, which are input. Note that in this specification, the state of a signal refers to a potential, a current, or a frequency of the signal, for example.

The start signal SP and the start signal SPB can be generated using a NOT circuit (inverter circuit) for example.

Note that as a signal here, an analog signal or a digital signal which uses voltage, current, resistance, frequency, or the like can be used, for example. For example, at least two potentials, that is, a first potential and a second potential are set, using a high-level (also referred to as high potential or $V_H$) potential as the first potential and a low-level (also referred to as low potential or $V_L$) potential as the second potential, whereby a binary digital signal can be set. Although it is preferable that $V_H$ and $V_L$ be a constant value, $V_H$ and $V_L$ may take a wide range of values, in consideration of influence of noise.

Note that here, terms with ordinal numbers, such as "first" and "second", are used in order to avoid confusion among components, and the terms do not limit the components numerically.

The second flip-flop has the following function: the output signal OUT of the first flip-flop is input as a start signal SP, a clock signal CK2 is input as the clock signal, and the second flip-flop outputs a signal FF2out as an output signal, which is set depending on the state of the output signal FF1out and the clock signal CK2 which are input.

A start signal SP and a start signal SPB are input to the second flip-flop, a clock signal CK2 is input thereto as a clock signal, and the second flip-flop outputs an output signal OUTB depending on the state of the signal SP, the signal SPB, and the clock signal CK2, which are input.

Figure 16B:
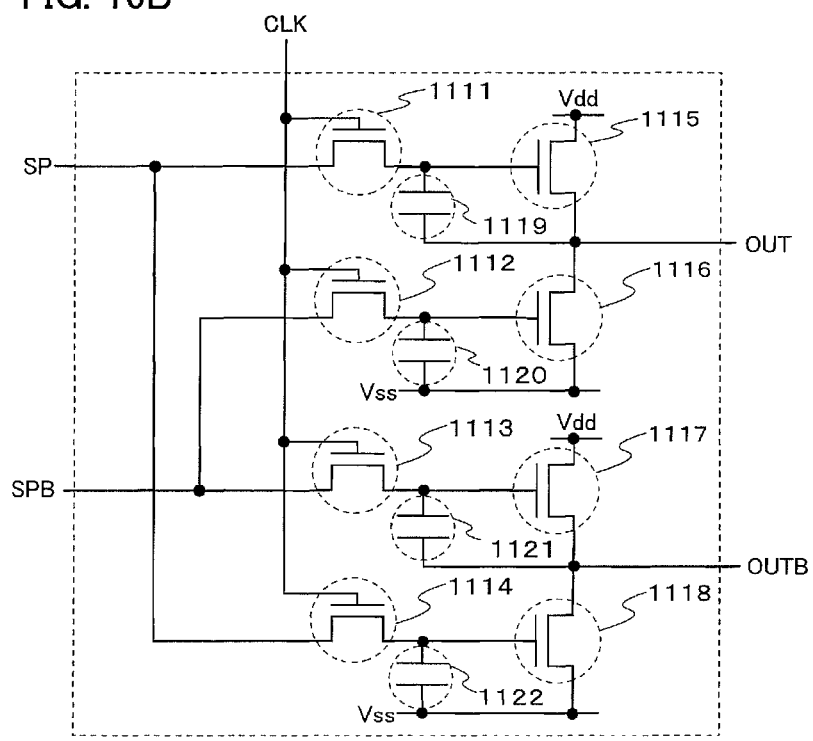

FIG. 16B illustrates a specific structural example of the first flip-flop illustrated in FIG. 16A.

The start signal SP is input to one of a source or a drain of a first thin film transistor 1111 and one of a source or a drain of a fourth thin film transistor 1114.

The start signal SPB is input to one of a source or a drain of a second thin film transistor 1112 and one of a source or a drain of a third thin film transistor 1113.

The clock signal CLK is input to each gate of the first thin film transistor 1111, the second thin film transistor 1112, the third thin film transistor 1113, and the fourth thin film transistor 1114.

The other of the source and the drain of the first thin film transistor 1111 is connected to a gate of a fifth thin film transistor 1115 and one electrode of a first capacitor element 1119.

The other of the source and the drain of the second thin film transistor 1112 is connected to a gate of a sixth thin film transistor 1116 and one electrode of a second capacitor element 1120.

The other of the source and the drain of the third thin film transistor 1113 is connected to a gate of a seventh thin film transistor 1117 and one electrode of a third capacitor element 1121.

The other of the source and the drain of the fourth thin film transistor 1114 is connected to a gate of an eighth thin film transistor 1118 and one electrode of a fourth capacitor element 1122.

A drain of the fifth thin film transistor 1115 is connected to a high potential side (preferably, a power supply potential Vdd). A source of the fifth thin film transistor 1115 is connected to the other electrode of the first capacitor element 1119 and a drain of the sixth thin film transistor 1116, and outputs an output signal OUT. The other electrode of the second capacitor element 1120 and a source of the sixth thin film transistor 1116 are connected to a low potential side (preferably, a reference potential Vss).

A drain of the seventh thin film transistor 1117 is connected to a high potential side (preferably, a power supply potential Vdd). A source of the seventh thin film transistor 1117 is connected to the other electrode of the third capacitor element 1121 and a drain of the eighth thin film transistor 1118, and outputs an output signal OUTB. The other electrode of the fourth capacitor element 1122 and a source of the eighth thin film transistor 1118 are connected to a low potential side (preferably, a reference potential Vss).

The first capacitor element 1119, the second capacitor element 1120, the third capacitor element 1121, and the fourth capacitor element 1122 can be formed over the same substrate as the thin film transistor, using the capacitor described in Embodiment 2.

As described above, a flip-flop circuit can be manufactured using the thin film transistor which uses a highly purified oxide semiconductor layer as described in Embodiment 1 or Embodiment 2 and the capacitor described in Embodiment 2.

Embodiment 8

In this embodiment, an example of a boosting circuit (a charge pump circuit) which can be formed using the thin film transistor in Embodiment 1 or Embodiment 2 is described.

Figure 17:
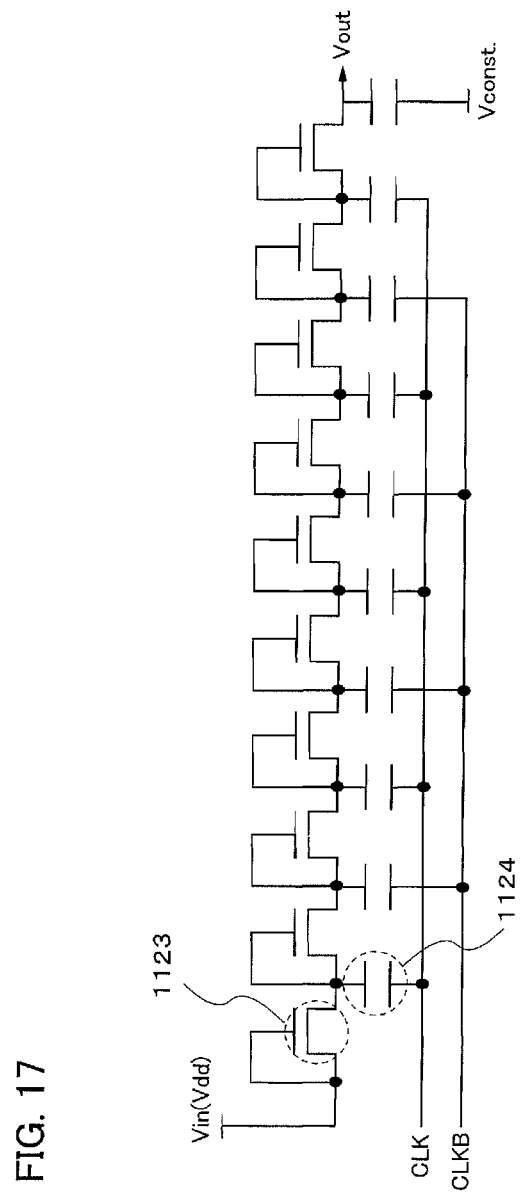
FIG. 17 is an equivalent circuit diagram illustrating one embodiment of the present invention.

FIG. 17 illustrates a specific structural example of a boosting circuit. The boosting circuit illustrated in FIG. 17 includes two clock signal lines, a plurality of transistors 1123 that are diode-connected in a forward direction, a plurality of capacitor elements 1124 whose one electrode is connected between a source and a drain of the plurality of transistors, and a storage capacitor element whose one electrode is connected to the last of the plurality of transistors and the other electrode is kept at a constant potential. The other electrode of the plurality of capacitor elements is electrically connected to either of the two clock signal lines.

Note that a clock signal line may be further provided.

A transistor and a capacitor element may be further provided in accordance with the potential desired to be output.

In the two clock signal lines, each clock signal is input as follows: when one clock signal line is switched to high level ($V_H$), the other is switched to low level ($V_L$).

Each of the clock signal CLK and the clock signal CLKB can be generated using a NOT circuit (inverter circuit) for example. A NOT circuit can be manufactured using the EDMOS circuit described in Embodiment 2.

By using the boosting circuit illustrated in FIG. 17, a potential input from Vin can be raised to Vout. For example, when a power supply potential Vdd is input from Vin, a potential higher than Vdd can be output from Vout and raised to a desired potential. Thus, a signal with a potential raised to a desired potential is input to a power supply line for example, and is used for each circuit mounted on the same substrate as the boosting circuit.

Note that here, a constant potential kept at the other electrode of the storage capacitor element may be a power supply potential Vdd or a reference potential Vss for example.

As a signal here, an analog signal or a digital signal which uses voltage, current, resistance, frequency, or the like can be used, for example. For example, at least two potentials, that is, a first potential and a second potential are set, a high-level (also referred to as high potential or $V_H$) potential is used as the first potential, and a low-level (also referred to as low potential or $V_L$) potential is used as the second potential, whereby a binary digital signal can be set. Although it is preferable that $V_H$ and $V_L$ be a constant value, $V_H$ and $V_L$ can take a wide range of values, in consideration of influence of noise.

Note that here, terms with ordinal numbers, such as "first" and "second", are used in order to avoid confusion among components, and the terms do not limit the components numerically.

As described above, a boosting circuit can be manufactured using the thin film transistor described in Embodiment 1 and the capacitor described in Embodiment 2.

Embodiment 9

In this embodiment, examples of an electronic device mounted with a semiconductor integrated circuit which can be obtained in any of Embodiments 1 to 8 are described with reference to FIGS. 18A to 18E. By using the method described in Embodiment 4, that is, a method of transferring a semiconductor integrated circuit from a formation substrate to another substrate, a semiconductor integrated circuit can be mounted on a plastic film or the like, so that electronic devices which are thinned or made flexible can be manufactured. Note that a semiconductor integrated circuit is mounted on a circuit board or the like and then incorporated inside the main body of electronic devices.

On a mother board, a semiconductor integrated circuit including the thin film transistor in Embodiment 1 or Embodiment 2 is mounted. A semiconductor integrated circuit is manufactured by mounting a logic circuit, a flash memory circuit, an SRAM circuit, a DRAM circuit described in Embodiment 6, and the like. Further, the CPU described in Embodiment 3 can be mounted as well. Note that the semiconductor integrated circuit can be mounted by a wire bonding method. In this case, integrated circuit films having various shapes can be mounted.

In addition, an FPC is attached to the circuit board, through which display devices or the like is connected thereto. The circuit board can form a driver and a controller of a display portion. The driver in the display portion includes the shift register described in Embodiment 7 or the EDMOS circuit described in Embodiment 2.

Figure 18A:
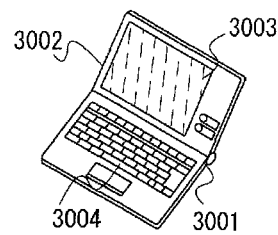
FIGS. 18A to 18E are views, each illustrating an example of an electronic device.

FIG. 18A illustrates a laptop personal computer manufactured by mounting at least a semiconductor integrated circuit as a component, which includes a main body 3001, a housing 3002, a display portion 3003, a keyboard 3004, and the like. The laptop personal computer includes the CPU described in Embodiment 3, the DRAM circuit described in Embodiment 6, or the like.

Figure 18B:
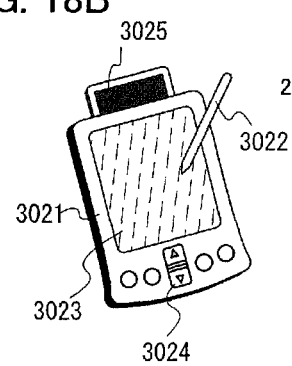

FIG. 18B is a portable information terminal (PDA) manufactured by mounting at least a semiconductor integrated circuit as a component, which includes a display portion 3023, an external interface 3025, an operation button 3024, and the like in a main body 3021. A stylus 3022 is included as an accessory for operation.

Figure 18C:
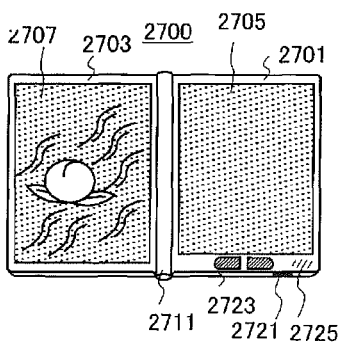

FIG. 18C is an electronic paper manufactured by mounting at least a semiconductor integrated circuit as a component. An electronic paper can be used for electronic appliances of a variety of fields as long as they can display data. For example, an electronic paper can be applied to an e-book reader (electronic book), a poster, an advertisement in a vehicle such as a train, displays of various cards such as a credit card, or the like. FIG. 18C illustrates an example of an electronic book reader. For example, the e-book reader 2700 includes two housings: a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 18C) can display text and a display portion on the left (the display portion 2707 in FIG. 18C) can display graphics.

FIG. 18C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 18D:
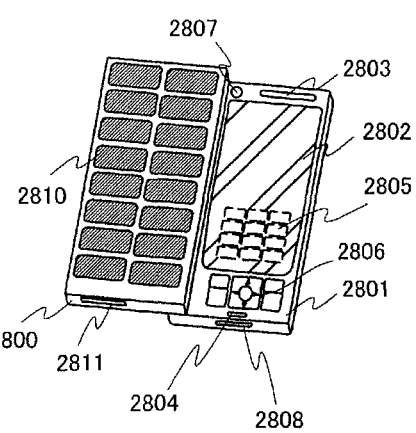

FIG. 18D is a cellular phone manufactured by mounting at least a semiconductor integrated circuit as a component, which includes two housings: a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar battery cell 2810 for charging of the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 18D. Note that the display panel 2802 is mounted with a booster circuit (the booster circuit described in Embodiment 8) for raising a voltage output from the solar battery cell 2810 to a voltage needed for each circuit.

Further, in addition to the above structure, a contactless IC chip, a small memory device, or the like described in Embodiment 4 or Embodiment 5 may be incorporated.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 18D can shift by sliding so that one is lapped over the other; therefore, the size of the cellular phone can be reduced, which makes the cellular phone suitable for being carried.

The external connection terminal 2808 can be connected to an AC adaptor and a variety of cables such as a USB cable, whereby charging and data communication with a personal computer or the like are possible. Furthermore, a large amount of data can be stored and moved by inserting a recording medium into the external memory slot 2811.

Further, in addition to the above functions, an infrared communication function, a television reception function, or the like may be provided.

Figure 18E:
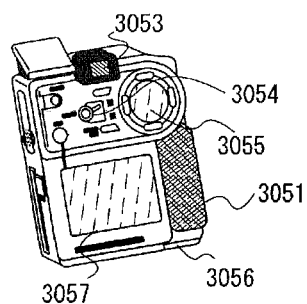

FIG. 18E is a digital camera manufactured by mounting at least a semiconductor integrated circuit as a component, which includes a main body 3051, a display portion (A) 3057, an eyepiece 3053, operation switches 3054, a display portion (B) 3055, a battery 3056, and the like.

This embodiment can be freely combined with any one of Embodiments 1 to 8.

This application is based on Japanese Patent Application serial no. 2009-238885 filed with Japan Patent Office on Oct. 16, 2009, the entire contents of which are hereby incorporated by reference.

EXPLANATION OF REFERENCE

100: semiconductor integrated circuit, 101: antenna, 102: second insulator, 112: first insulator, 400: semiconductor integrated circuit chip, 405: antenna, 406: supporting substrate, 407: dashed line, 408: power feeding point, 410: insulating layer, 420: semiconductor device, 421: interrogator, 422: antenna, 423: semiconductor integrated circuit, 424: antenna, 430: substrate, 431: wiring, 432a: oxide semiconductor layer, 432b: oxide semiconductor layer, 433; first capacitor electrode layer, 434: second capacitor electrode layer, 435: fifth wiring, 437: conductive layer, 438: second electrode layer, 439: first terminal electrode layer, 440: thin film transistor, 441: gate electrode layer, 442: oxide semiconductor layer, 443: second insulating layer, 444: gate insulating layer, 445a: source electrode layer, 445b: drain electrode layer, 446: fourth insulating layer, 447a: insulating layer, 447b: insulating layer, 448a: source electrode layer, 448b: drain electrode layer, 470: thin film transistor, 471: first gate electrode layer, 472: oxide semiconductor layer, 473: fifth insulating layer, 474a: wiring layer, 474b: wiring layer, 475a: source electrode layer, 475b: drain electrode layer, 477: first electrode layer, 478a: source electrode layer, 478b: drain electrode layer, 479a to 479i: electrode layers, 480: first thin film transistor, 481: first gate electrode layer, 482a: oxide semiconductor layer, 482b: oxide semiconductor layer, 484a: wiring, 484b: wiring, 485a: drain electrode layer, 485b: source electrode layer, 486: insulating layer, 487a: insulating layer, 487b: insulating layer, 488a: drain electrode layer, 488b: source electrode layer, 489: terminal electrode layer, 490: second thin film transistor, 491: second gate electrode layer, 492: gate insulating layer, 495a: source electrode layer, 495b: drain electrode layer, 498a: source electrode layer, 498b: drain electrode layer, 800: semiconductor device, 810: high frequency circuit, 820: power supply circuit, 830: reset circuit, 840: clock generating circuit, 850: data demodulating circuit, 860: data modulating circuit, 870: control circuit, 880: memory circuit, 890: antenna, 910: code extraction circuit, 920: code determining circuit, 930: CRC determining circuit, 940: output unit circuit, 1001: CPU, 1002: timing control circuit 1003: instruction decoder, 1004: register array, 1005: address logic and buffer circuit, 1006: data bus interface, 1007: ALU, 1008: instruction register, 1100: memory element, 1101: first AND circuit, 1102: second AND circuit, 1103: third AND circuit, 1104: switch, 1105: switch, 1106: switch, 1111: thin film transistor, 1112: thin film transistor 1113: thin film transistor, 1114: thin film transistor, 1115: thin film transistor, 1116: thin film transistor, 1117: thin film transistor, 1118: thin film transistor, 1119: capacitor element, 1120: capacitor element, 1121: capacitor element, 1122: capacitor element, 1123: transistor, 1124: capacitor element, 3200: communication device, 3210: display portion, 3220: article, 3230: semiconductor device, 3240: communication device, 3250: semiconductor device, 3260: product

The invention claimed is:

1. A semiconductor device comprising:
a substrate having an insulating surface;
a first gate electrode layer over the substrate;
a first electrode layer over the substrate;
a first gate insulating layer over the first gate electrode layer and the first electrode layer;
an oxide semiconductor layer over the first gate insulating layer;
a first insulating layer over the first electrode layer;
a source electrode layer and a drain electrode layer over the oxide semiconductor layer;
a second gate insulating layer over the oxide semiconductor layer, the source electrode layer, and the drain electrode layer; and
a second gate electrode layer over the second gate insulating layer,
wherein at least part of the drain electrode layer overlaps with the first electrode layer, and
wherein the first insulating layer and the first gate insulating layer are provided between the drain electrode layer and the first electrode layer.

2. The semiconductor device according to claim 1, wherein the semiconductor device is a CPU.

3. The semiconductor device according to claim 1, wherein the semiconductor device is an LSI.

4. The semiconductor device according to claim 1, wherein the semiconductor device is a DRAM.

5. The semiconductor device according to claim 1,
wherein a hydrogen concentration in the oxide semiconductor layer is lower than or equal to $5 \times 10^{19}$ atoms/cm$^3$, and
wherein a carrier concentration in the oxide semiconductor layer is lower than or equal to $5 \times 10^{14}$/cm$^3$.

6. The semiconductor device according to claim 1, wherein the semiconductor device is an EDMOS circuit.

7. A semiconductor device comprising an EDMOS circuit comprising:
a substrate having an insulating surface;
a first thin film transistor over the substrate; and
a second thin film transistor over the substrate,
wherein the first thin film transistor comprises:
a first gate electrode layer;
a first gate insulating layer over the first gate electrode layer;
an first oxide semiconductor layer over the first gate insulating layer;
a first source electrode layer and a first drain electrode layer over the first oxide semiconductor layer;
a second gate insulating layer over the first oxide semiconductor layer, the first source electrode layer, and the first drain electrode layer; and
a second gate electrode layer over the second gate insulating layer,
wherein the second thin film transistor comprises:
a first insulating layer;
a second oxide semiconductor layer over the first insulating layer;
a second source electrode layer and a second drain electrode layer over the second oxide semiconductor layer;
a third gate insulating layer over the second oxide semiconductor layer, the second source electrode layer, and the second drain electrode layer; and
a third gate electrode layer over the third gate insulating layer,
wherein the first drain electrode layer is electrically connected to the second source electrode layer, and
wherein the third gate electrode layer is electrically connected to the second source electrode layer.

8. The semiconductor device according to claim 7, wherein an off-current value in each of the first thin film transistor and the second thin film transistor is less than or equal to $1 \times 10^{-13}$ A.

9. The semiconductor device according to claim 7,
wherein a hydrogen concentration in each of the first oxide semiconductor layer and the second oxide semiconductor layer is lower than or equal to $5 \times 10^{19}$ atoms/cm$^3$, and
wherein a carrier concentration in each of the first oxide semiconductor layer and the second oxide semiconductor layer is lower than or equal to $5 \times 10^{14}$/cm$^3$.

10. The semiconductor device according to claim 7,
wherein a channel length of the first thin film transistor is longer than a channel length of the second thin film transistor.

11. The semiconductor device according to claim 7,
wherein a thickness of the first oxide semiconductor layer is smaller than a thickness of the second oxide semiconductor layer.

12. The semiconductor device according to claim 7, wherein the semiconductor device is a CPU.

13. The semiconductor device according to claim 7, wherein the semiconductor device is an LSI.

14. The semiconductor device according to claim 7, wherein the semiconductor device is a DRAM.

* * * * *

UNITED STATES PATENT AND TRADEMARK OFFICE
CERTIFICATE OF CORRECTION

PATENT NO. : 8,421,068 B2  Page 1 of 1
APPLICATION NO. : 12/904565
DATED : April 16, 2013
INVENTOR(S) : Shunpei Yamazaki et al.

It is certified that error appears in the above-identified patent and that said Letters Patent is hereby corrected as shown below:

In the Specifications

Column 2, line 47, replace "+IV" with --+1V--;

Column 6, line 38, replace "4476" with --447b--;

Column 6, line 41, replace "4476" with --447b--;

Column 6, line 56, replace "4476" with --447b--;

Column 7, line 44, replace "4476" with --447b--;

Column 16, line 40, replace "4876" with --487b--;

Column 17, line 13, replace "4846" with --484b--;

Column 17, line 32, replace "4886" with --488b--; and

Column 17, line 36, replace "4986" with --498b--.

Signed and Sealed this
Sixteenth Day of July, 2013

Teresa Stanek Rea
*Acting Director of the United States Patent and Trademark Office*